(12) United States Patent
Ootake et al.

(10) Patent No.: US 8,088,875 B2
(45) Date of Patent: Jan. 3, 2012

(54) (METH)ACRYLATE, POLYMER AND RESIST COMPOSITION

(75) Inventors: Atsushi Ootake, Saitama (JP); Tadashi Nakamura, Yokohama (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 24 days.

(21) Appl. No.: 11/596,865

(22) PCT Filed: May 17, 2005

(86) PCT No.: PCT/JP2005/008955
§ 371 (c)(1),
(2), (4) Date: Nov. 17, 2006

(87) PCT Pub. No.: WO2005/113617
PCT Pub. Date: Dec. 1, 2005

(65) Prior Publication Data
US 2008/0003529 A1 Jan. 3, 2008

(30) Foreign Application Priority Data

May 20, 2004 (JP) .............................. P2004-150822
Nov. 4, 2004 (JP) .............................. P2004-320606

(51) Int. Cl.
C08F 20/18 (2006.01)
C08F 20/68 (2006.01)
G03F 7/004 (2006.01)
G03F 7/039 (2006.01)

(52) U.S. Cl. ....................... 526/319; 430/270.1; 430/326
(58) Field of Classification Search ............... 430/270.1, 430/326; 526/280, 318, 319
See application file for complete search history.

(56) References Cited

U.S. PATENT DOCUMENTS

| 5,985,522 | A  | * | 11/1999 | Iwasa et al. ..................... 430/315 |
| 6,030,747 | A  | * | 2/2000  | Nakano et al. ............. 430/270.1 |
| 6,239,231 | B1 | * | 5/2001  | Fujishima et al. ............. 525/337 |
| 6,287,746 | B1 |   | 9/2001  | Nakano et al. ............. 430/270.1 |
| 2002/0058197 | A1 |   | 5/2002 | Nozaki et al. ............... 430/270.1 |
| 2003/0059715 | A1 | * | 3/2003 | Sato ............................ 430/287.1 |
| 2003/0087183 | A1 | * | 5/2003 | Nishi et al. ................. 430/270.1 |
| 2004/0185373 | A1 | * | 9/2004 | Kodama ..................... 430/270.1 |
| 2006/0127801 | A1 |   | 6/2006 | Momose et al. ........... 430/270.1 |

FOREIGN PATENT DOCUMENTS

| JP | 11 30864 | 2/1999 |
| JP | 2000-26446 | 1/2000 |
| JP | 2000-309611 | 11/2000 |
| JP | 2001-356478 | 12/2001 |
| JP | 2002-182393 | 6/2002 |
| JP | 2003 122007 | 4/2003 |
| JP | 2003 147023 | 5/2003 |
| JP | 2003 330192 | 11/2003 |
| JP | 2005 70316 | 3/2005 |
| WO | WO 2004/007587 A1 | 1/2004 |
| WO | WO 2004/077160 A2 | 9/2004 |

OTHER PUBLICATIONS

Mitsuharu, Y., Toshiro, I., Hiroshi, Y. and Hiroyohi, T- Deblocking reaction of chemically amplified positive DUV resists, Journal of Photopolymer Science and Technology, vol. 12, No. 4 (1999), pp. 601-608.*

Machine translation of JP 2000-026446, published on Jan. 25, 2001.*
Machine translation of JP 2001-356478, published on Dec. 26, 2001.*
Office Action mailed May 20, 2011, in co-pending U.S. Appl. No. 12/393,455.

* cited by examiner

*Primary Examiner* — Anca Eoff
(74) *Attorney, Agent, or Firm* — Oblon, Spivak, McClelland, Maier & Neustadt, L.L.P.

(57) ABSTRACT

A polymer contains a constituent unit having a specific acetal skeleton. This polymer is able to be used as a resist resin in DUV excimer laser lithography, electron beam lithography, EUV lithography, or the like.

8 Claims, 5 Drawing Sheets

(METH)ACRYLATE, POLYMER AND RESIST COMPOSITION

TECHNICAL FIELD

The present invention relates to a polymer which is useful as a constituent component resin material of a positive resist, and a monomer which is useful as a raw material of a polymer for positive resist. Also the present invention relates to a resist composition using the polymer, and a pattern forming method, and, particularly, to a polymer for chemically amplified photoresist, which is suited for micro-processing using excimer laser, electron beam and X-ray.

BACKGROUND ART

Recently, in the field of micro-processing in the production of semiconductor devices and liquid crystal devices, fine patterning has rapidly been developed with the progress of lithography technique. In a technique for fine patterning, irradiation light having a shorter wavelength used. Specifically, ultraviolet ray typified by g-ray (wavelength: 438 nm) or i-ray (wavelength: 365 nm used as conventional irradiation light has been replaced by DUV (Deep Ultra Violet).

At present, a KrF excimer laser (wavelength: 248 nm) lithography technique is introduced in the market and a trial of introducing an ArF excimer laser (wavelength: 193 nm) lithography technique, which is intended to realize shorter wavelength, has been made. Furthermore, a $F_2$ excimer laser (wavelength: 157 nm lithography technique has been studied as a next generation technique. As a lithography technique, which is slightly different from these techniques, an electron beam lithography technique and a EUV lithography technique has intensively been studied.

As a high resolution resist to irradiation light having a short wavelength or electron beam, a "chemically amplified photoresist" containing a photo acid generator is proposed and the chemically amplified photoresist are intensively improved and developed at present. In a chemically amplified positive resist, a dissolution rate to an alkali developing solution of a polymer for resist must be increased by an action of an acid and a polymer having a structure, in which hydrophilic groups are protected with acid-eliminating protective groups, is widely used. As a resist for ArF excimer laser lithography patent document 1 discloses a polymer having, as a constituent unit, a monomer in which meth)acrylic acid is protected with an acid-eliminating protective group. Patent document 2 discloses a polymer containing a constituent unit represented by the following formula (5).

[Chemical Formula 1]

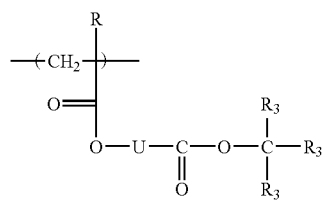

(5)

in the general formula (5), R represents a hydrogen atom, a methyl group, a linear or branched hydroxyalkyl group having 1 to 4 carbon atoms, or a linear or branched fluorinated alkyl group having 1 to 4 carbon atoms; $R^3$ each independently represents a monovalent alicyclic hydrocarbon group having 4 to 20 carbon atoms or a derivative thereof, or a linear or branched alkyl group having 1 to 4 carbon atoms, and at least one of $R^3$(s) represents the alicyclic hydrocarbon group or a derivative thereof, or any two $R^3$(s) are combined with each other together with carbon atoms attached thereto to form a divalent alicyclic hydrocarbon group having 4 to 20 carbon atoms or a derivative thereof, and the remaining $R^3$ represents a linear or branched alkyl group having 1 to 4 carbon atoms or a monovalent alicyclic hydrocarbon group having 4 to 20 carbon atoms or a derivative thereof; and U represents a divalent bridged hydrocarbon group having 5 to 12 carbon atoms.

However, in the case of preparing the (meth)acrylate for forming an acid-eliminating constituent unit represented by the general formula (5) described in patent document 2, the esterification reaction between (meth)acrylic acid having a bridged hydrocarbon group combined with a carboxyl group (structure U in the general formula (5)) and a tertiary alcohol $(C(R_3)_3OH)$ must be conducted. In this case, in order to increase reactivity of the esterification reaction, the esterification reaction must be conducted after forming an acid anhydride of (meth)acrylic acid having a bridged hydrocarbon group combined with a carboxyl group, or reacting the (meth acrylic acid having a bridged hydrocarbon group combined with a carboxyl group with thionyl chloride to form an acid chloride, and there was a problem such as a lot of reaction steps are required.

Patent document 1: Japanese Unexamined Patent Application, First Publication No. 2003-122007

Patent document 2: Japanese Unexamined Patent Application, First Publication No. 2003-330192

Problems to be Solved by the Invention

An object of the present invention is to provide a (meth) acrylate which can introduce an acid-eliminating group by a simple method including few reaction steps. Another object of the present invention is to provide a polymer using the (meth)acrylate, and a resist composition using the polymer.

The present inventors have intensively studied so as to achieve the above objects and found that a (meth)acrylate having a structure in which a specific ring structure is combined with an acetal-containing structure is capable of introducing an acid-eliminating group by a simple method and the polymer is useful as a constituent component resin material of a positive resist, and thus the present invention has been completed.

Namely the first gist of the present invention lies in a polymer containing a constituent unit represented by the following formula (1):

[Chemical Formula 2]

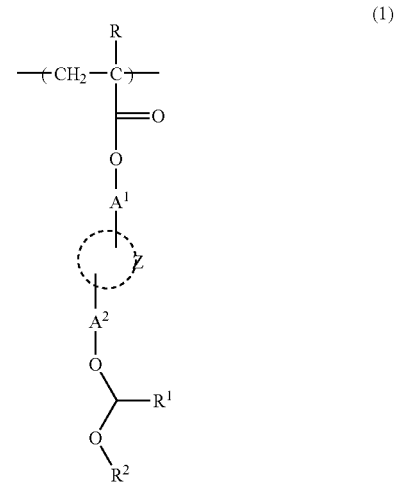

(1)

in the formula (1), R represents a hydrogen atom or a methyl group, $R^1$ and $R^2$ each independently represents a hydrogen atom or an alkyl group having 1 to 20 carbon atoms, or $R^1$ and $R^2$ are combined with each other to form a ring structure, $A^1$ represents a single bond, alkylene, oxyalkylene, or —C(O)O— or —CH$_2$CH$_2$OC(O)—; $A^2$ represents a single bond, alkylene, oxyalkylene, —CO—, —C(O)O—, or —C(O)OCH$_2$CH$_2$—; and Z represents a cyclohexane ring, norbornane ring, bicyclo[2.2.2]octane ring or tetracyclo[4.4.0.1$^{2,5}$]dodecane ring, all of which may have a substituent.

The second gist of the present invention lies in the polymer wherein the formula (1) is a constituent unit represented by the following formula (2):

[Chemical Formula 3]

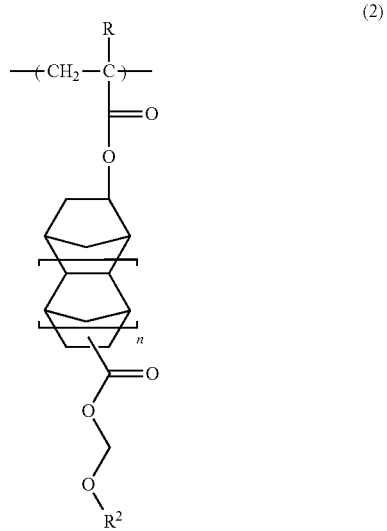

(2)

in, the formula (2), R represents a hydrogen atom or a methyl group, and $R^2$ represents an alkyl group having 1 to 20 carbon atoms.

The third gist of the present invention lies in a (meth)acrylate represented by the following formula (3):

[Chemical Formula 4]

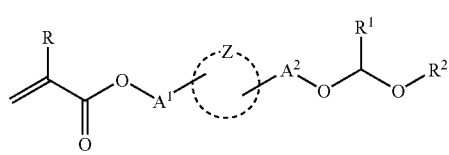

(3)

in the formula (3), R, $R^1$, $R^2$, $A^1$, $A^2$ and Z are as defined in the formula (1).

The fourth gist of the present invention lies in the (meth)acrylate wherein the formula (3) is represented by the following formula (4):

[Chemical Formula 5]

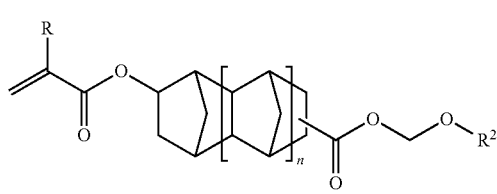

(4)

in the formula (4), R represents a hydrogen atom or a methyl group, $R^2$ represents an alkyl group having 1 to 20 carbon atoms, and n is 0 or 1.

The fifth gist of the present invention lies in a resist composition comprising the above polymer.

The sixth gist of the present invention lies in a pattern forming method comprising the steps of coating the above resist composition on a to-be-processed substrate, exposing the coated substrate to light having a wavelength of 250 nm or less, and developing the exposed substrate using a developing solution to for a pattern.

Effects of the Invention

According to the present invention, it becomes possible to introduce an acid eliminating group into a (meth)acrylate using a simple method by introducing an acetal structure into a specific ring structure. A polymer using the (meth)acrylate is useful as a positive resist.

BEST MODE FOR CARRYING OUT THE INVENTION

Figure 1:
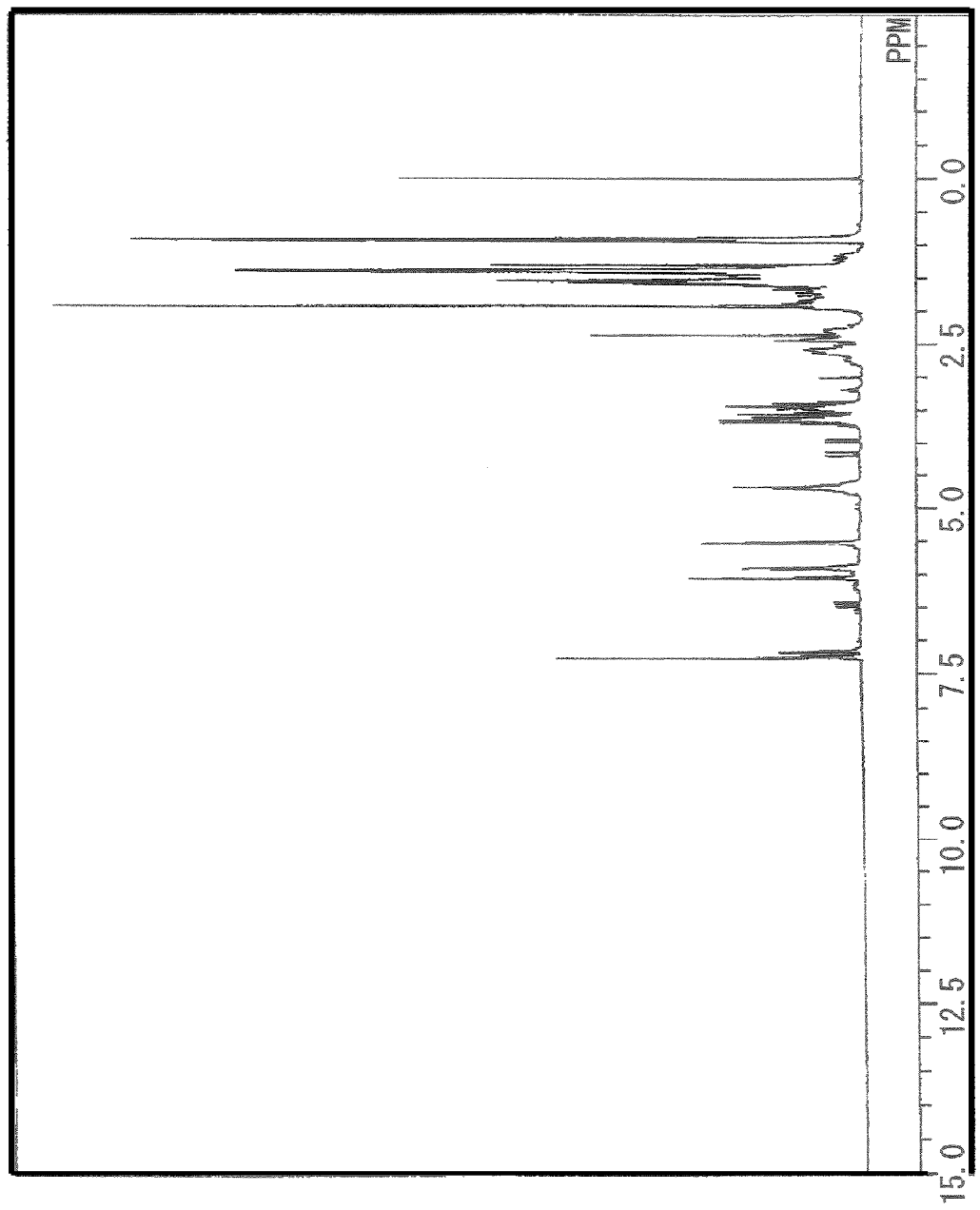
FIG. 1 is a graph showing the measurement results of $^1$H-NMR of a methacrylate represented by the formula (A-1) obtained in Example 1.
Figure 2:
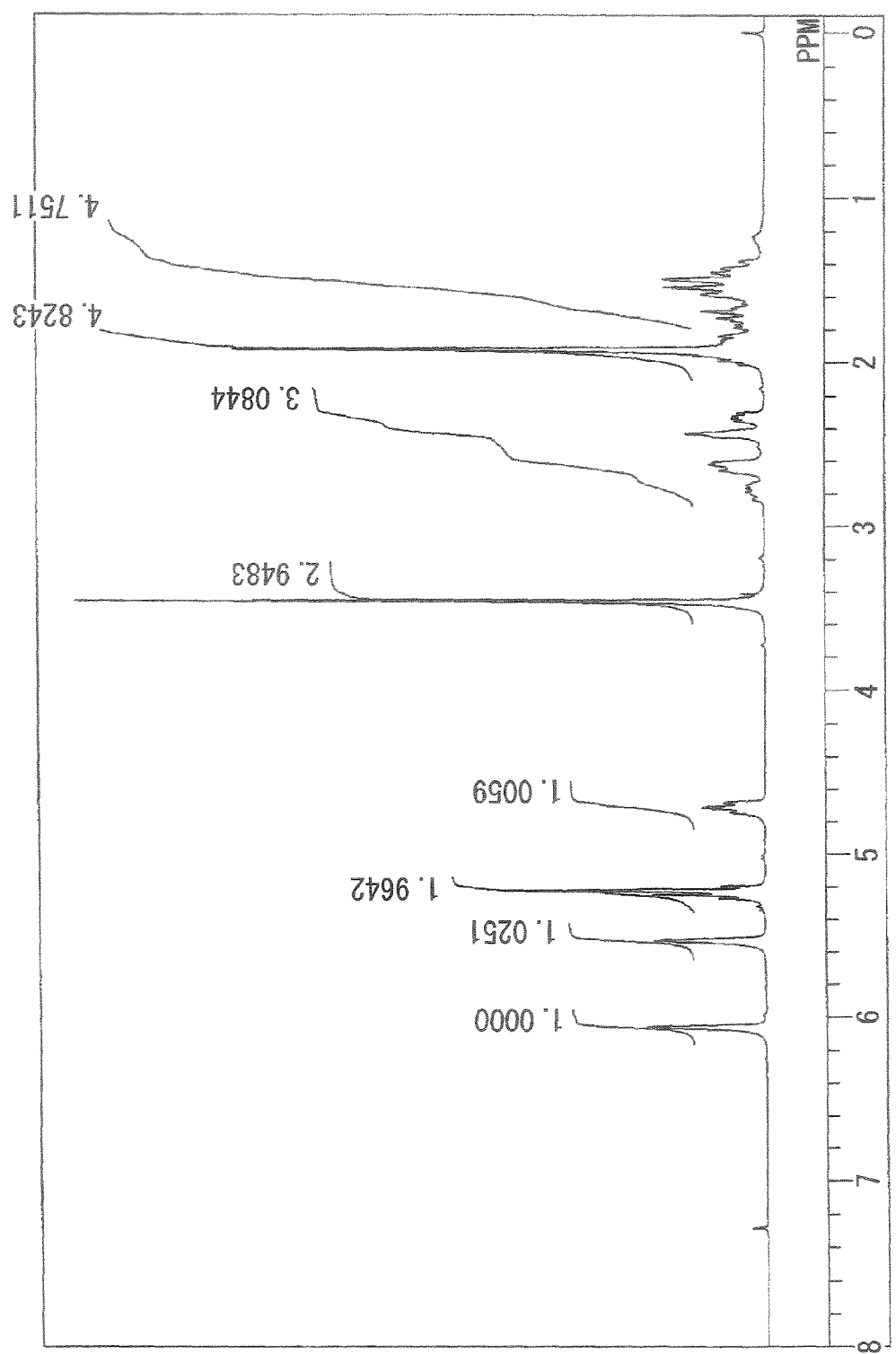
FIG. 2 is a graph showing the measurement results of $^1$H-NMR of a methacrylate represented by the formula (A-2) obtained in Example 3.
Figure 3:
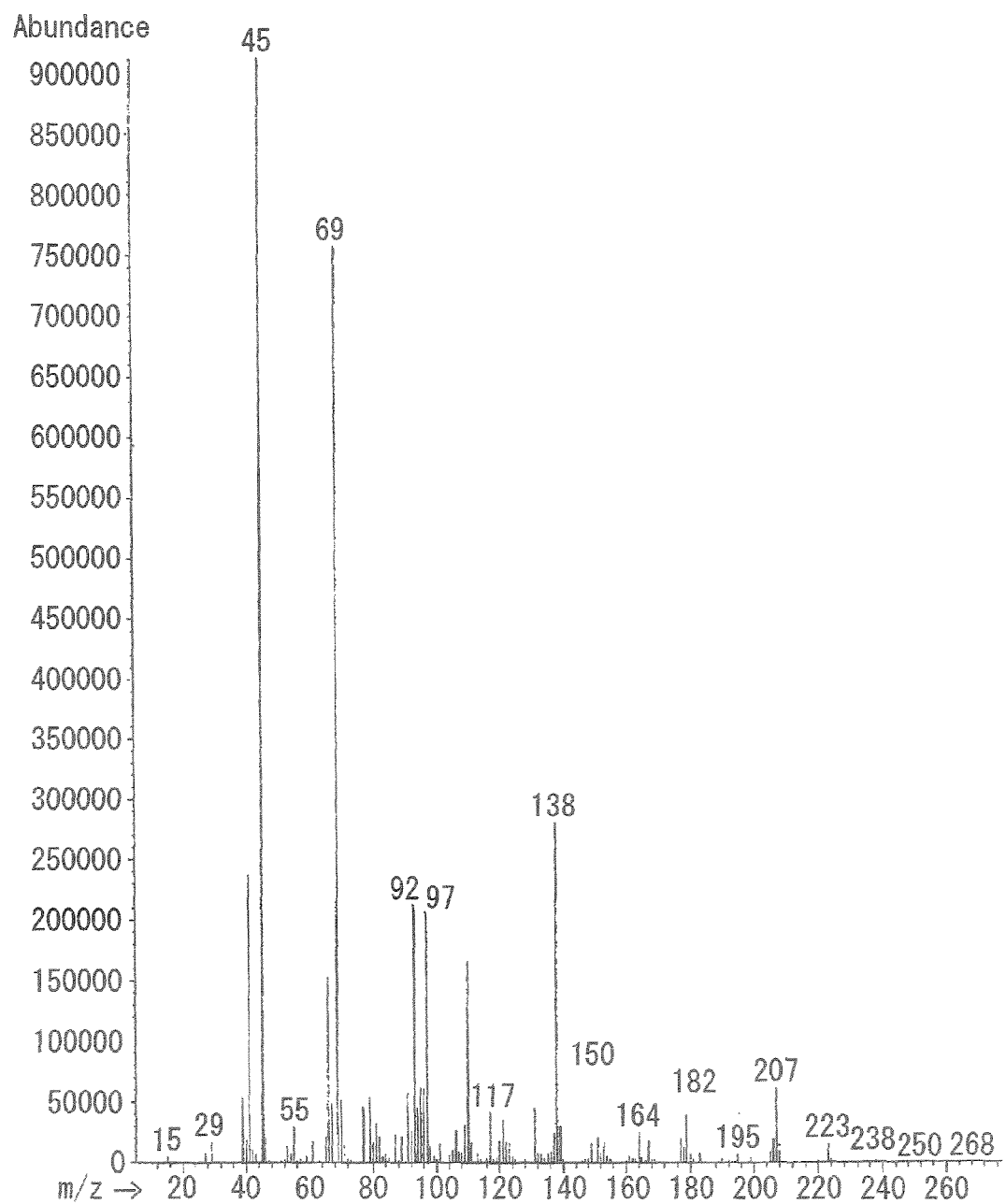
FIG. 3 is a graph showing the measurement results of mass spectrometry of a methacrylate represented by the formula (A-2) obtained in Example 3.
Figure 4:
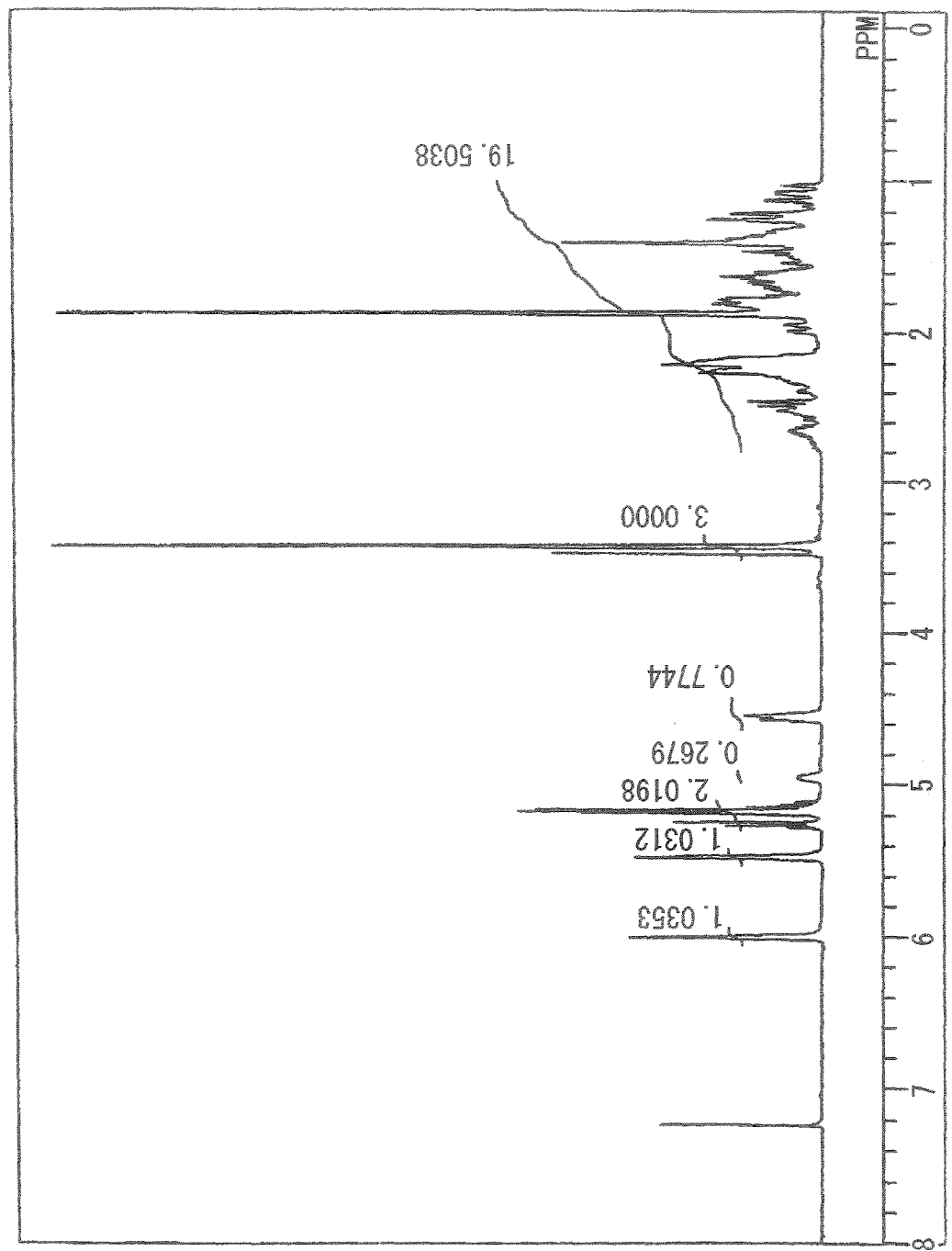
FIG. 4 is a graph showing the measurement results of $^1$H-NMR of a methacrylate represented by the formula (A-3) obtained in Example 5.
Figure 5:
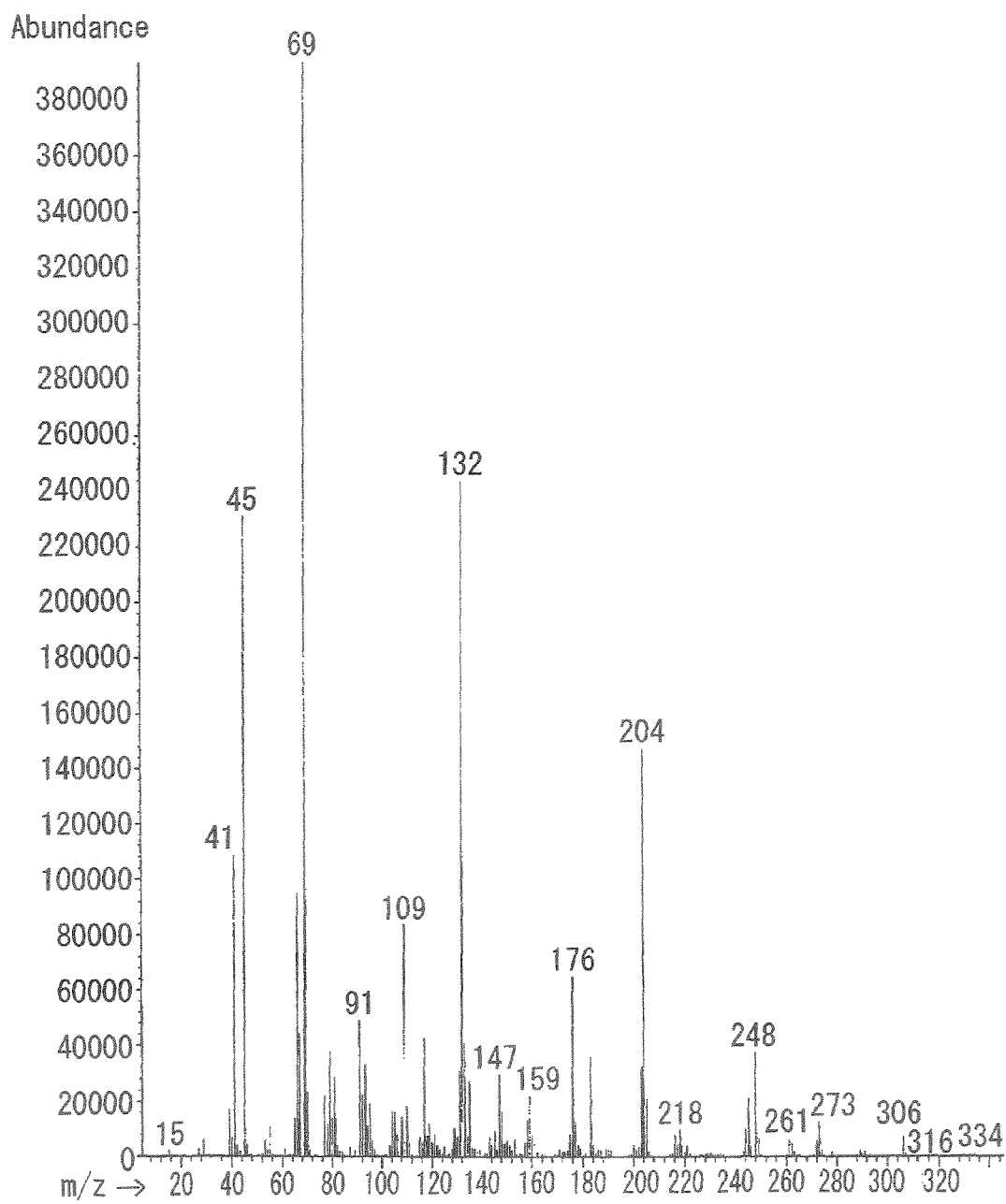
FIG. 5 is a graph showing the measurement results of mass spectrometry of a methacrylate represented by the formula (A-3) obtained in Example 5.

1. Polymer and Method for Producing the Polymer of the Present Invention

First, the polymer of the present invention will be described.

In the present invention, "(meth)acrylic acid" means methacrylic acid or acrylic acid.

The polymer of the present invention contains a constituent unit represented by the formula 1 and is particularly useful as a raw resin of a resist composition. The polymer of the present invention is excellent in transparency to light having a wavelength of 250 nm or less and therefore it can be used as a polymer for KrF resist a polymer for ArF resist and a polymer for F$_2$ resist, and can be particularly preferably used as a polymer for ArF resist.

The polymer of the present invention contains a cyclohexane ring norbornane ring, a bicyclo[2.2.2]octane ring, or a tetracyclo[4.4.0.1$^{2,5}$]dodecane ring, all of which may have a substituent, represented by Z in the formula (1). Examples of the substituent include, but are not limited to, linear or branched alkyl group having 1 to 6 carbon atoms, which may have at least one group selected from the group consisting of hydroxy group, carboxy group, acyl group having 1 to 6 carbon atoms, alkoxy group having 1 to 6 carbon atoms, carboxy group esterified with an alcohol having 1 to 6 carbon atoms and amino group; hydroxy group; carboxy group; acyl group having 1 to 6 carbon atoms; alkoxy group having 1 to 6 carbon atoms; carboxy group esterified with an alcohol having 1 to 6 carbon atoms; or amino group. When the polymer contains a cyclic saturated hydrocarbon group, the resulting resist is excellent in etching resistance. The cyclic saturated hydrocarbon group is preferably a norbornane ring or a cyclohexane ring because the material is easily available, and is preferably a bicyclo[2.2.2]octane ring or a tetracyclo [4.4.0.1$^{2,5}$]dodecane ring in view of etching resistance.

The polymer of the present invention contains an acetal combined with the cyclic saturated hydrocarbon group via a single bond, alkylene, oxyalkylene, —O—, —CO—, —C(O) O—, or —CH$_2$CH$_2$OC(O)—. The acetal is decomposed in the presence of an acid catalyst to produce a carboxy group or a hydroxy group. Utilizing the fact that solubility of the resin varies by this reaction, the polymer can be used in resist compositions for metal etching, photo application, plate making, hologram, color filter, and phase difference film. The polymer can be particularly preferably used in a chemically amplified positive resist using a photo acid generator. Furthermore, when the polymer of the present invention is used as a raw resin of a positive resist composition, the resulting resist composition is excellent in line edge roughness. The reason is considered as follows. Namely, when the acetal is decomposed under acidic conditions, physical properties other than solubility of the resin cause less change than those of a conventional polymer for positive resist. When the polymer of the present invention is used as a raw resin of the resist composition trailing is suppressed. The reason is considered that the acetal is easily decomposed by an acid.

In the present invention, a constituent unit represented by the formula (1) is a constituent unit represented by the following formula (2):

[Chemical Formula 6]

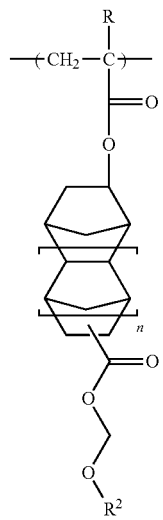

(2)

in the formula (2), R represents a hydrogen atom or a methyl group, and R$^2$ represents an alkyl group having 1 to 20 carbon atoms.

The polymer containing the constituent unit represented by the formula (2) is particularly preferable because the acetal structure has high thermostability and therefore the polymer is excellent in storage stability. The polymer is particularly preferable because of excellent line edge roughness. The reason is considered to be a carboxy group protected with an alkoxymethyl group. It is considered that, in the case of the alkoxymethyl group, the size of a group eliminated under acidic conditions is comparatively smaller than that in the case of the other acid-eliminating group such as tertiary ester group or alkoxyethyl group and therefore physical properties other than solubility of the resin cause less change. It is considered that the alkoxymethyl group has low eliminating energy as compared with an acid-eliminating group such as tertiary ester group, which has conventionally been used in a chemically amplified positive resist, and suppresses the occurrence of trailing.

The polymer of the present invention can be produced by polymerizing a (meth)acrylate monomer represented by the following formula (3):

[Chemical Formula 7]

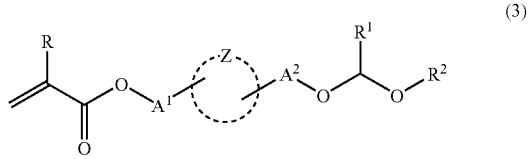

(3)

in the formula (3), R, R$^1$, R$^2$, A$^1$, A$^2$ and Z are as defined in the formula (1)

Specific examples of the monomer represented by the formula (3) include monomers represented by the following formulas (3-1) to (3-91). In the formulas (3-1) to (3-91), R and Z are as defined in the formula (1).

[Chemical Formula 8]

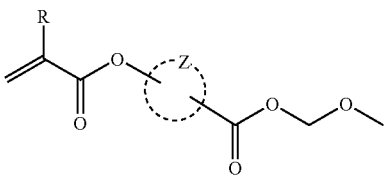

(3-1)

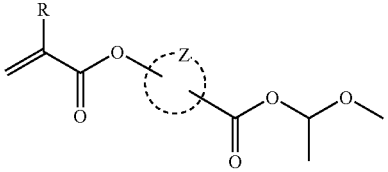

(3-2)

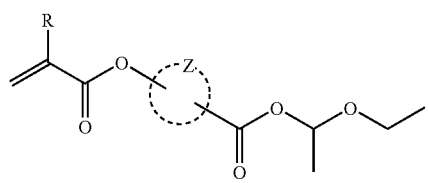

(3-3)

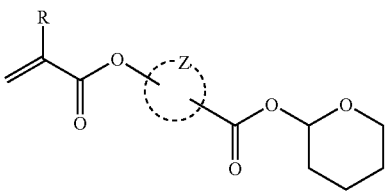

(3-4)

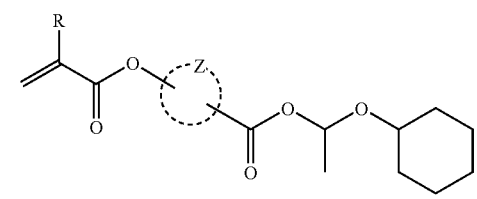
(3-5)
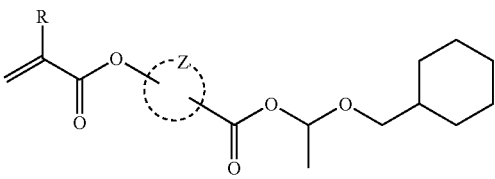
(3-6)
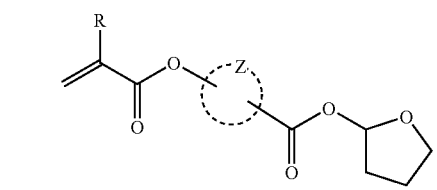
(3-7)
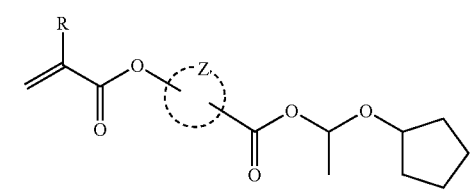
(3-8)
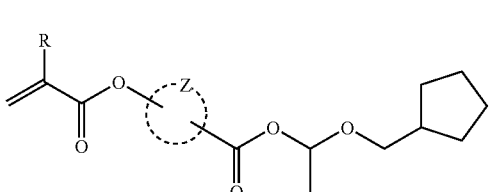
(3-9)
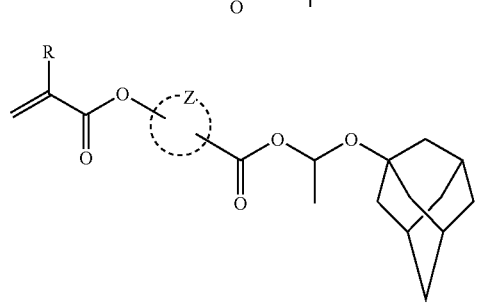
(3-10)
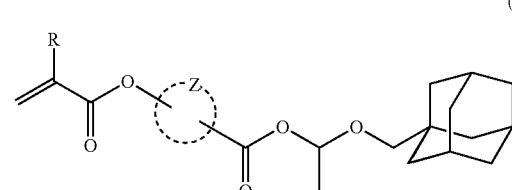
(3-11)
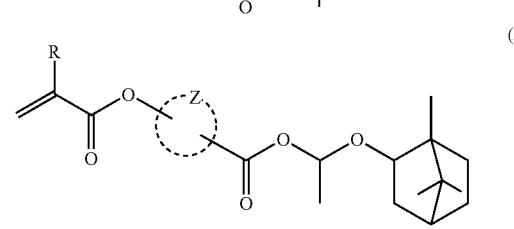
(3-12)
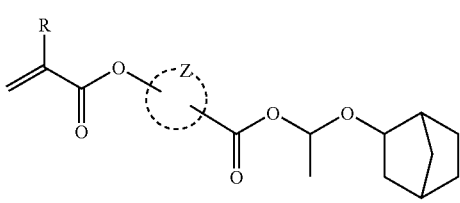
(3-13)
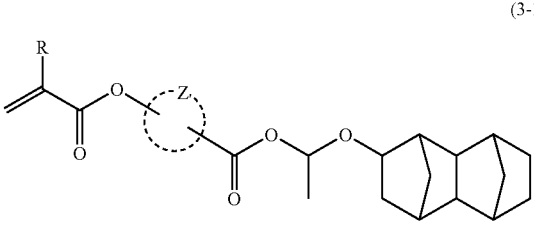
(3-14)
[Chemical Formula 9]
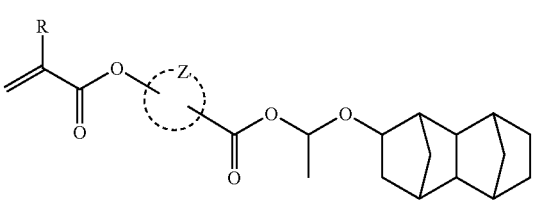
(3-15)
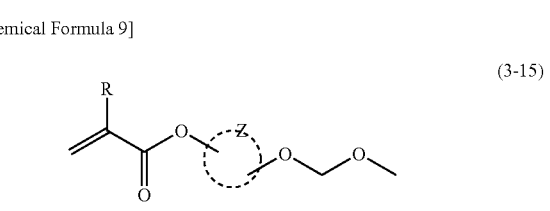
(3-16)
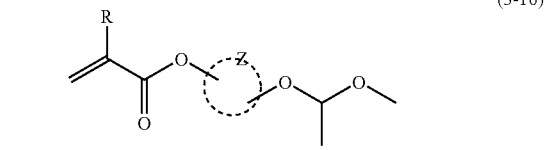
(3-17)
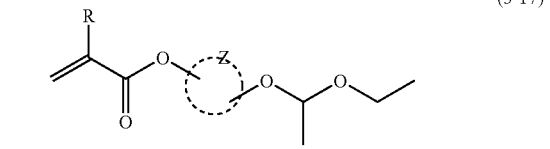
(3-18)
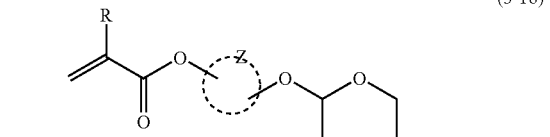
(3-19)
(3-20)
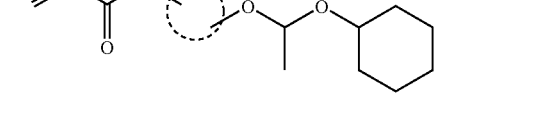
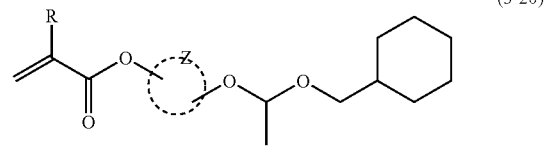

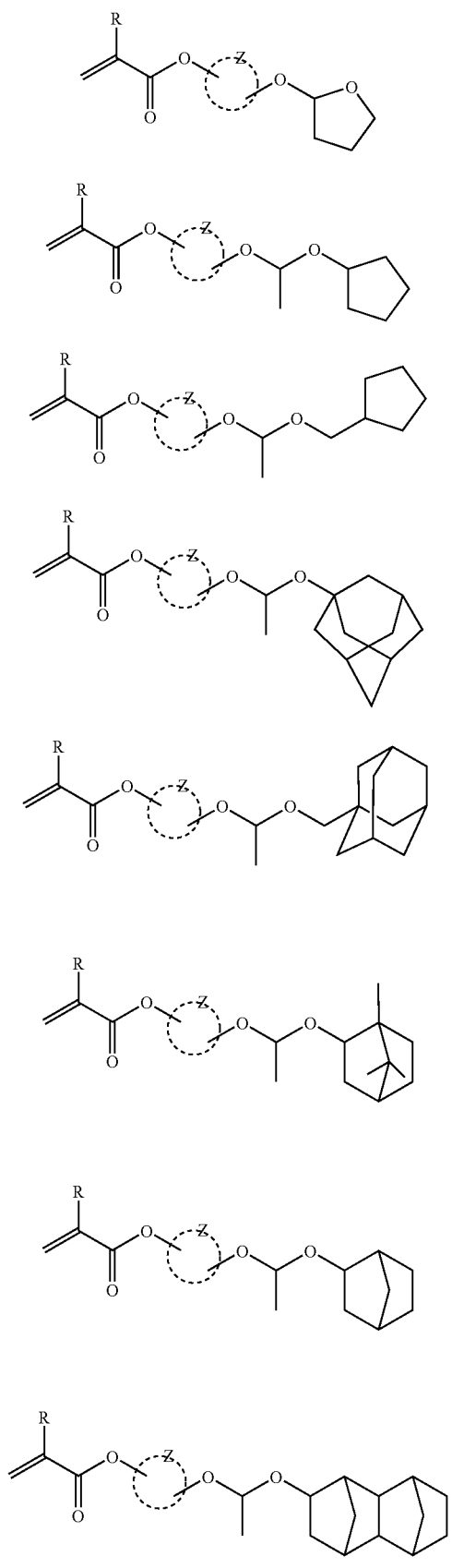

(3-38)
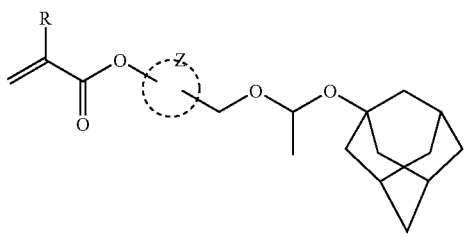
(3-39)
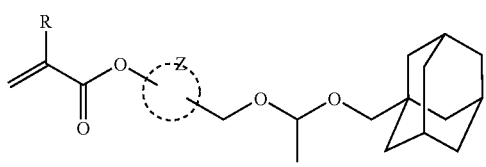
(3-40)
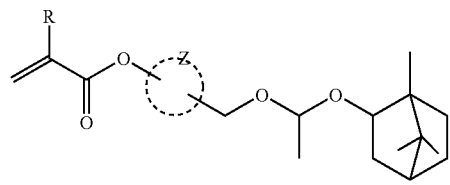
(3-41)
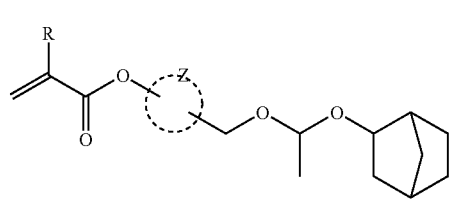
(3-42)
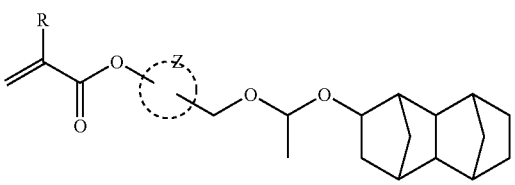
[Chemical Formula 11]
(3-43)
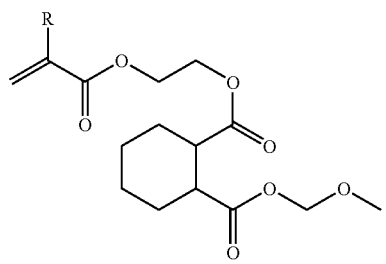
(3-44)
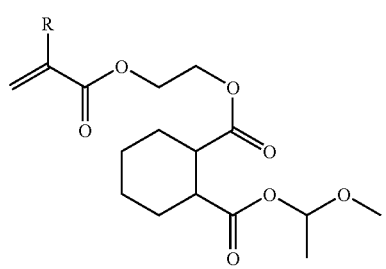
(3-45)
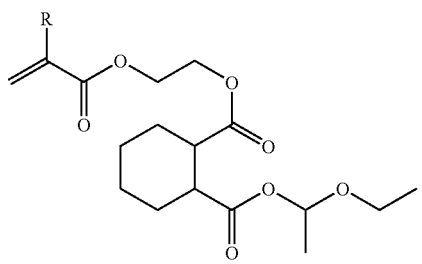
(3-46)
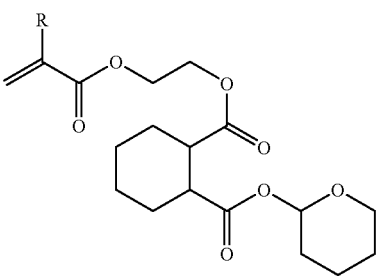
(3-47)
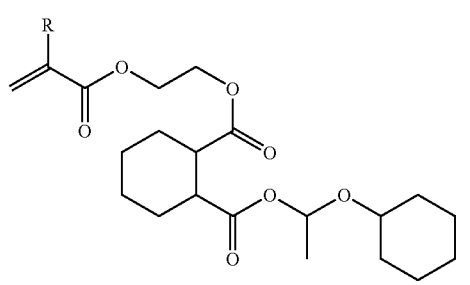
(3-48)
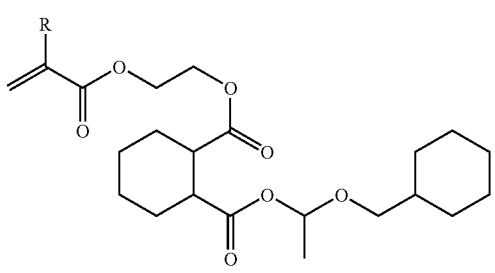
(3-49)
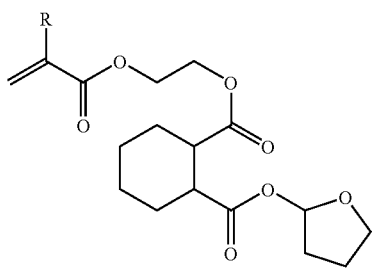
(3-50)
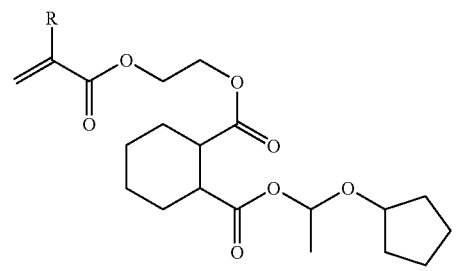

(3-51)
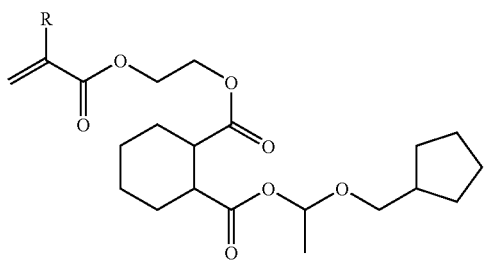
(3-52)
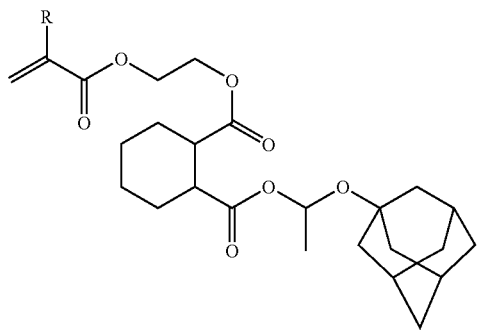
(3-53)
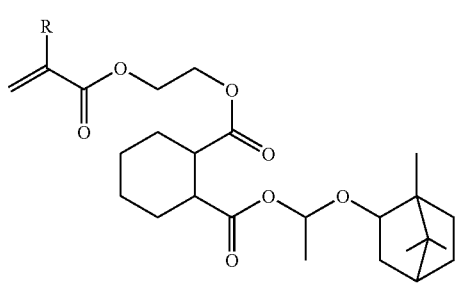
(3-54)
(3-55)
(3-56)
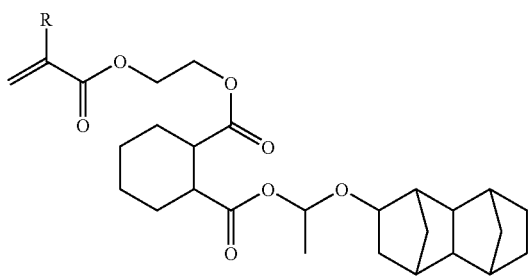
[Chemical Formula 12]
(3-57)
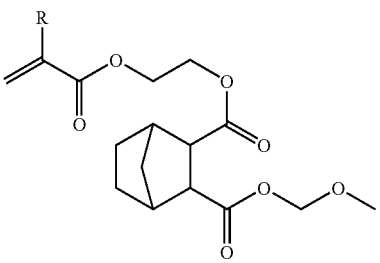
(3-58)
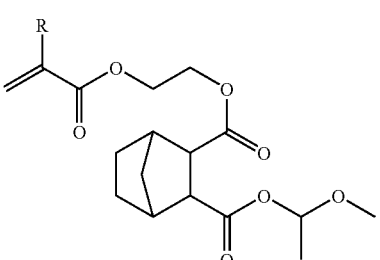
(3-59)
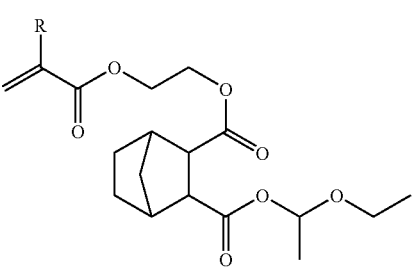
(3-60)
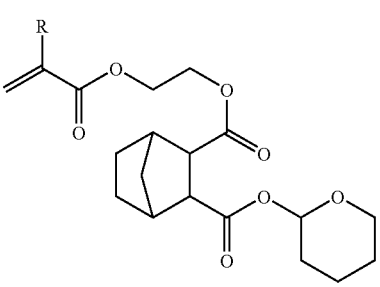

-continued
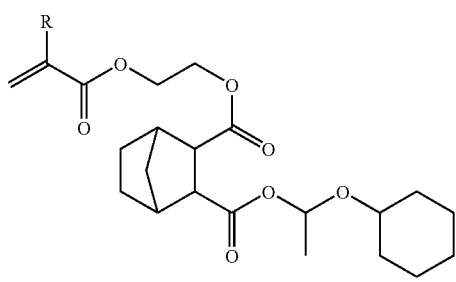
(3-61)
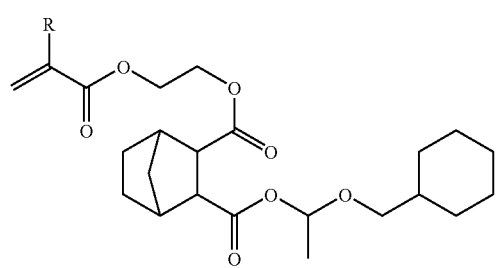
(3-62)
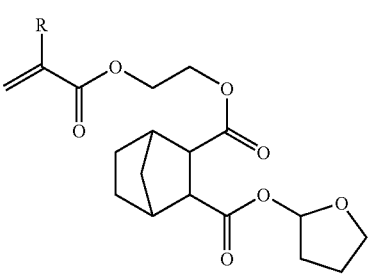
(3-63)
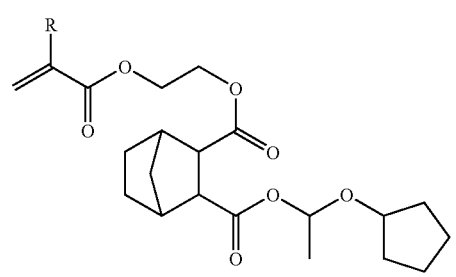
(3-64)
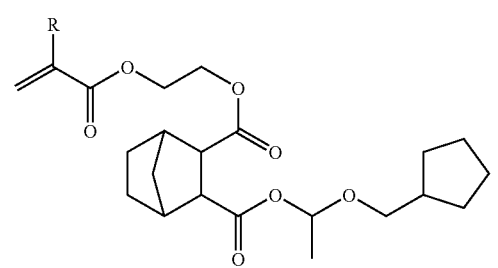
(3-65)
-continued
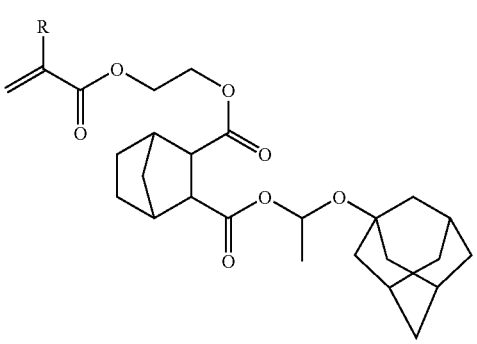
(3-66)
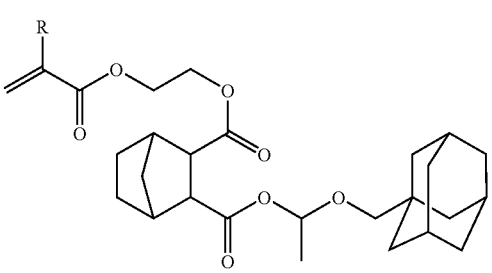
(3-67)
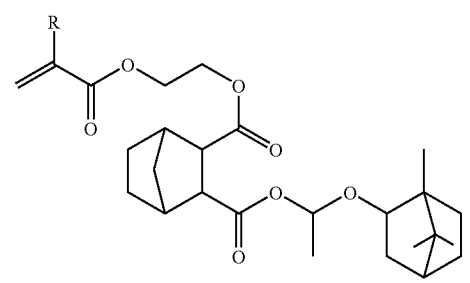
(3-68)
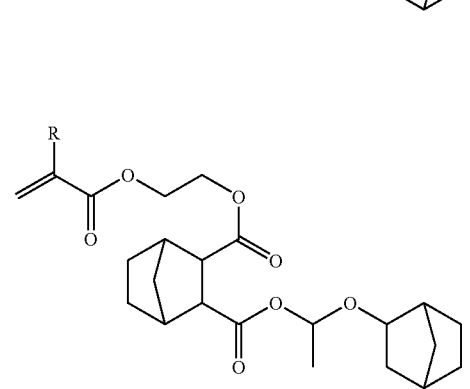
(3-69)
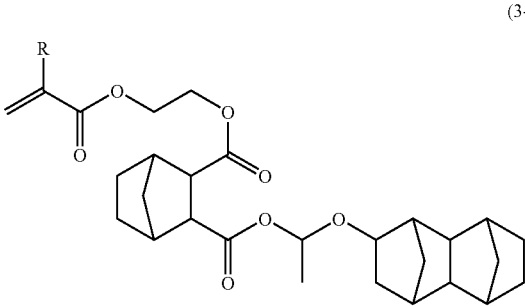
(3-70)

[Chemical Formula 13]
(3-71) 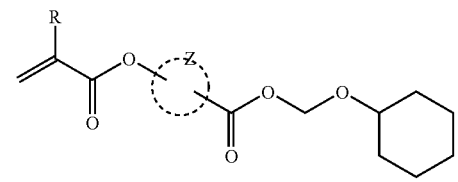
(3-72) 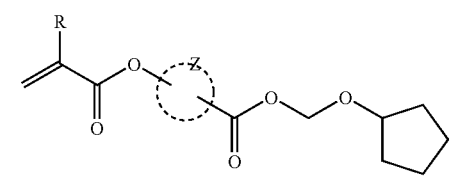
(3-73) 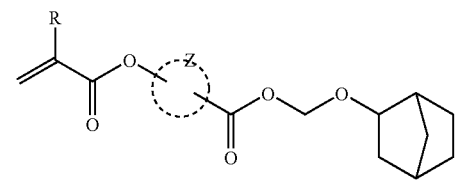
(3-74) 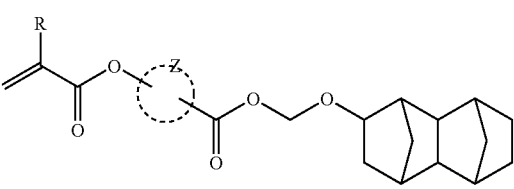
(3-75) 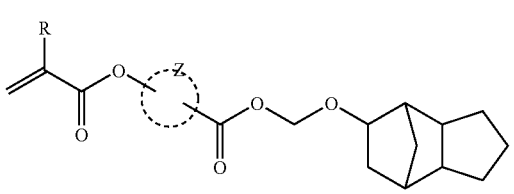
(3-76) 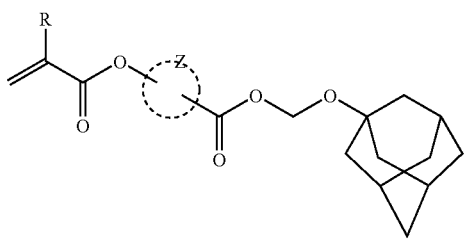
(3-77) 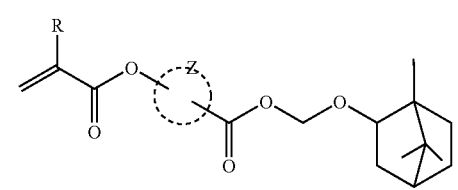
[Chemical Formula 14]
(3-78) 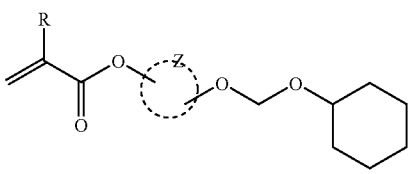
(3-79) 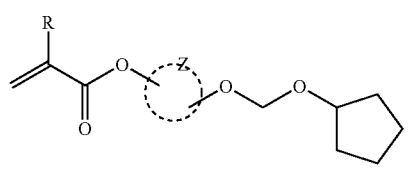
(3-80) 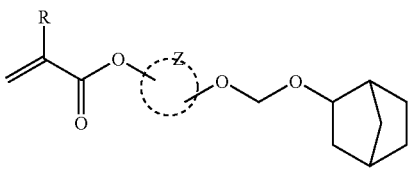
(3-81) 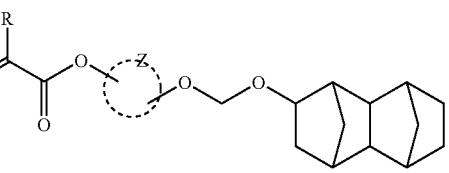
(3-82) 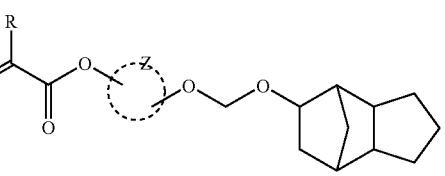
(3-83) 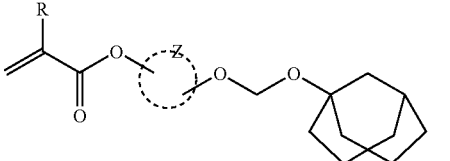
(3-84) 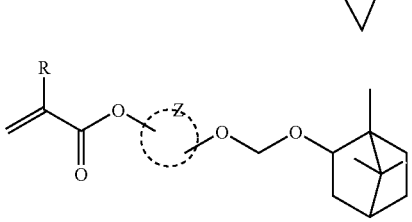
[Chemical Formula 15]
(3-85) 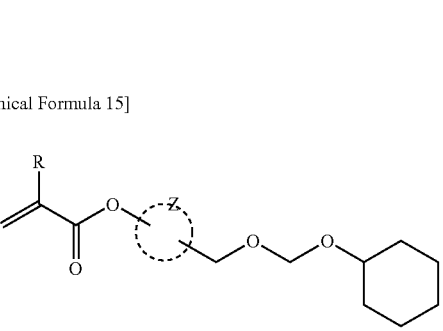

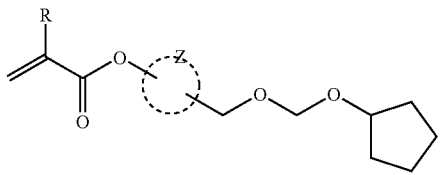

(3-86)

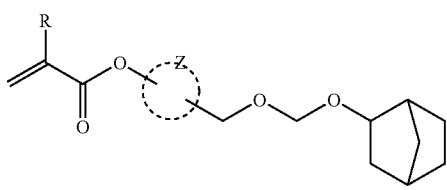

(3-87)

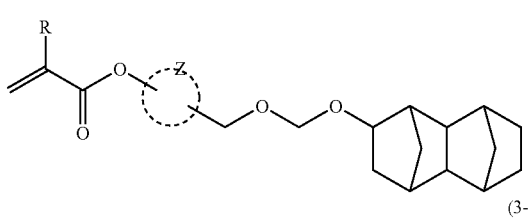

(3-88)

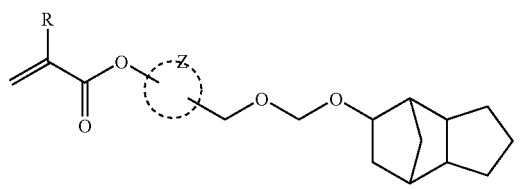

(3-89)

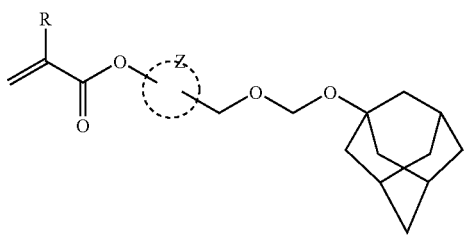

(3-90)

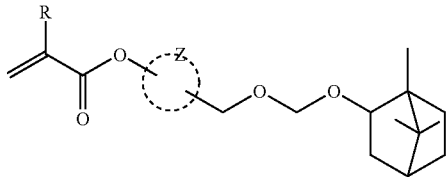

(3-91)

Among these monomers, monomers represented by the formulas (3-10) to (3-14), (3-24) to (3-28), and (3-38) to (3-42) are preferable because they are excellent in etching resistance when used as the polymer for positive resist and monomers represented by the formulas (3-10), (3-11), (3-24), (3-25), (3-38), and (3-39) in which Z is a bicyclo[2.2.2]octane ring are particularly preferable. Monomers represented by the formulas (3-5), (3-6), (3-8), (3-9), (3-9), (3-20), (3-22), (3-23), (3-33), (3-34), (3-36), and (3-37) in which Z is a norbornane ring, a bicyclo[2.2.2]octane ring, or a tetracyclo[4.4.0.1$^{2,5}$]dodecane ring are particularly preferable because they cause less line edge roughness when used as the polymer for positive resist, and monomers represented by the formulas (3-5), (3-6), (3-8), and (3-9) in which Z is a norbornane ring, a bicyclo[2.2.2]octane ring, or a tetracyclo[4.4.0.1$^{2,5}$]dodecane ring are particularly preferable.

In view of thermostability, monomers represented by the formulas (3-1), (3-43), (3-57), (3-64), and (3-71) to (3-77) are preferable, and the monomer represented by the following formula (4 is particularly preferable:

[Chemical Formula 16]

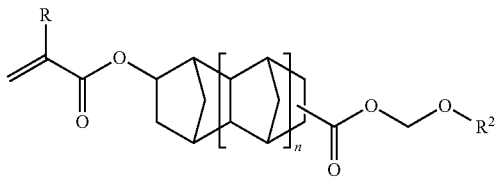

(4)

in the formula (4), R represents a hydrogen atom or a methyl group, $R^2$ represents an alkyl group having 1 to 20 carbon atoms, and n is 0 or 1.

When the (meth)acrylate represented by the formula (4) is used as a raw material of the polymer for positive resist, it tends to be excellent in storage stability because the acetal structure has high thermostability. The (meth)acrylate is particularly preferable because of excellent line edge roughness. The reason is considered to be a carboxy group protected with a alkoxymethyl group. It is considered that, in the case of the alkoxymethyl group, the size of a group eliminated under acidic conditions is comparatively smaller than that in the case of the other acid-eliminating group such as tertiary ester group or alkoxyethyl group and therefore physical properties other than solubility of the resin cause less change. It is considered that the alkoxymethyl group has low eliminating energy as compared with an acid-eliminating group such as tertiary ester group, which has conventionally been used in a chemically amplified positive resist, and suppresses the occurrence of trailing.

In the (meth)acrylate represented by the formula (4), when n is 0, it is represented by the following formula (4A) and, when n is 1, it is represented by the following formula (4B):

[Chemical Formula 17]

(4A)

(4B)

in the formulas (1A) and (1B), R represents a hydrogen atom or a methyl group, and $R^1$ represents an alkyl group having 1 to 20 carbon atoms.

Specific examples of the (meth)acrylate represented by the formulas (1A) and (1B) include (meth)acrylates represented by the following formulas (4A-1) to (4A-22) and (4B-1) to (4B-22).

[Chemical Formula 18]
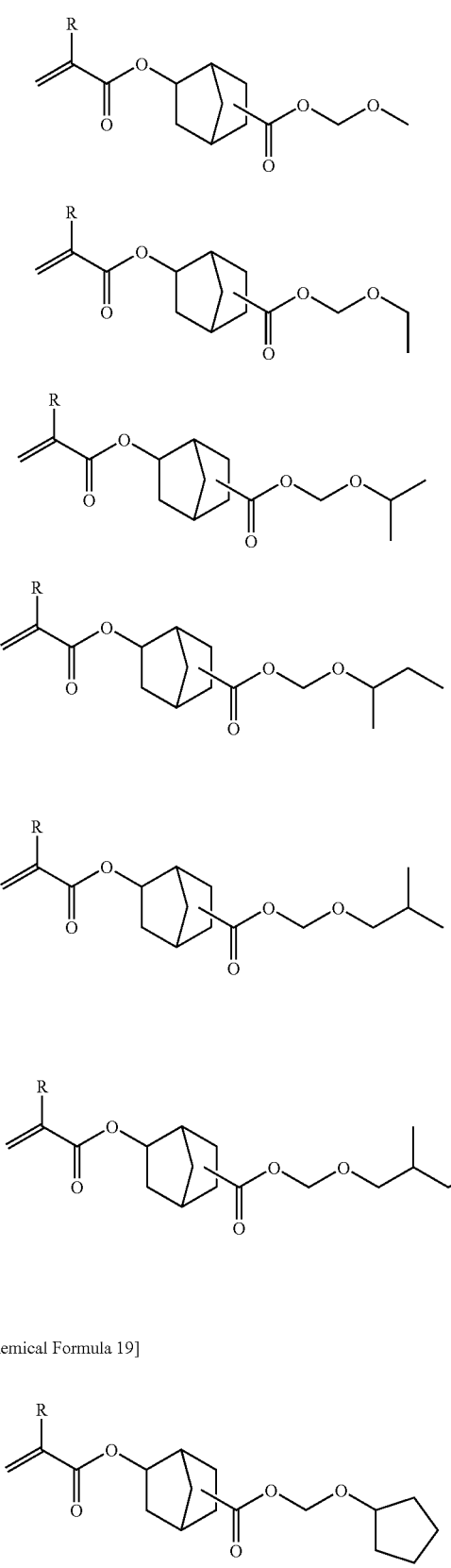
[Chemical Formula 19]
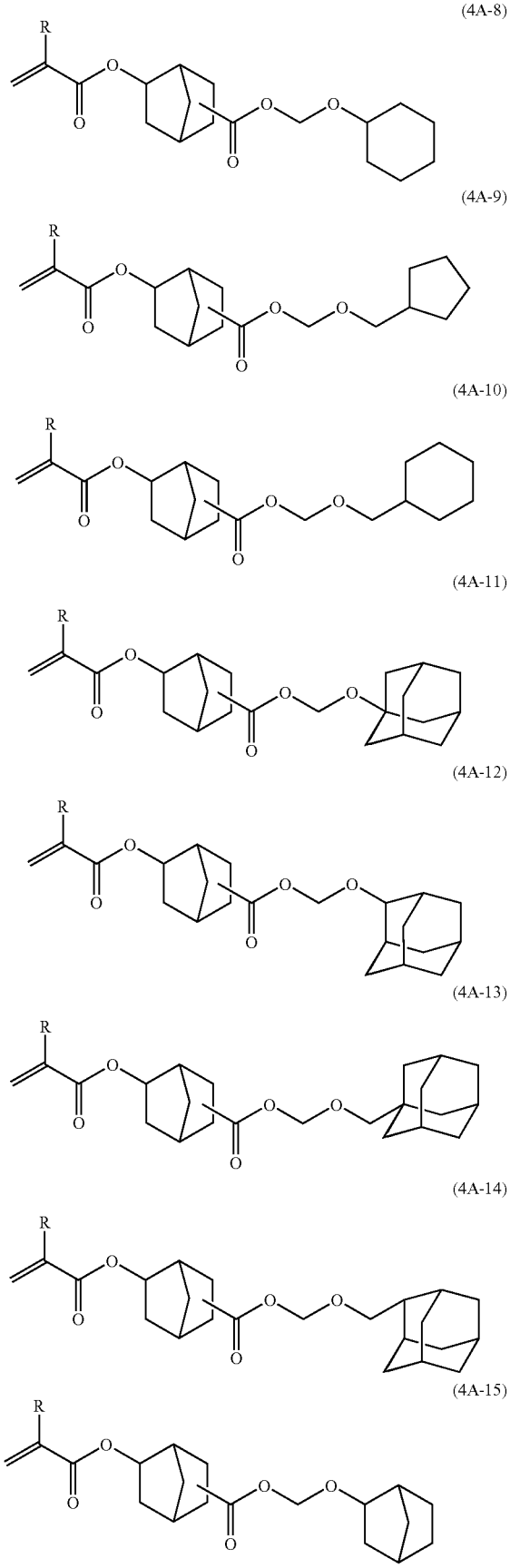

-continued
(4A-16)
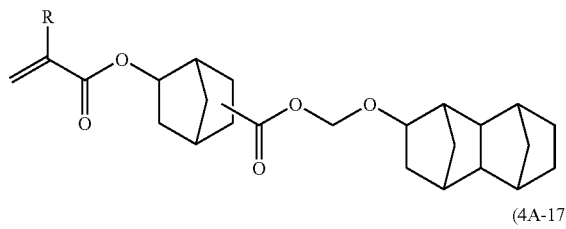
[Chemical Formula 21]
(4B-1)
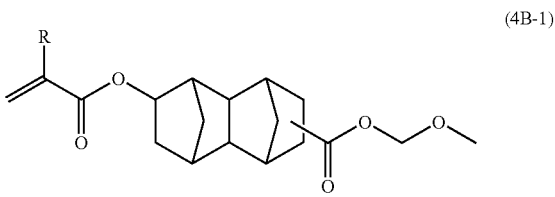
(4A-17)
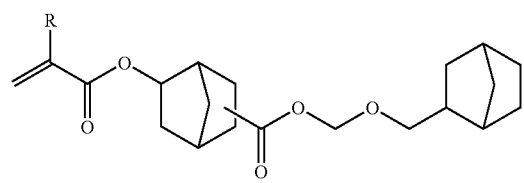
(4B-2)
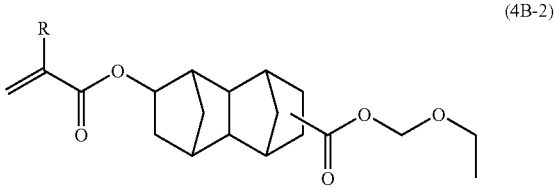
(4A-18)
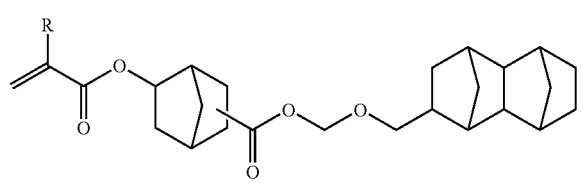
(4B-3)
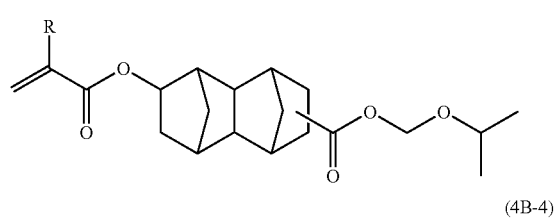
[Chemical Formula 20]
(4A-19)
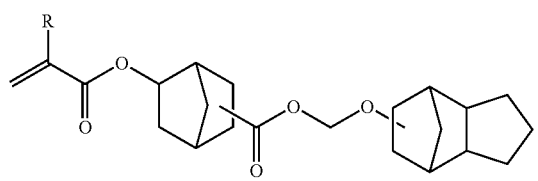
(4B-4)
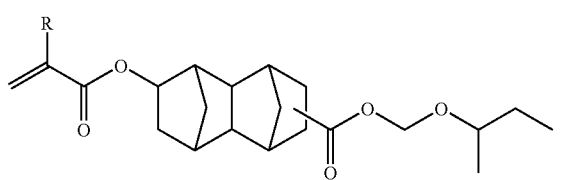
(4A-20)
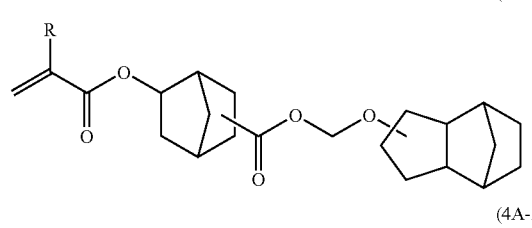
(4B-5)
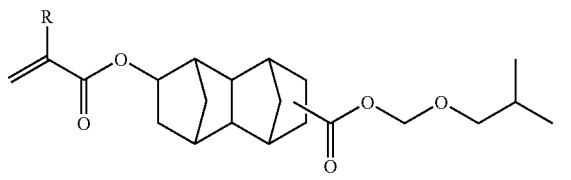
(4A-21)
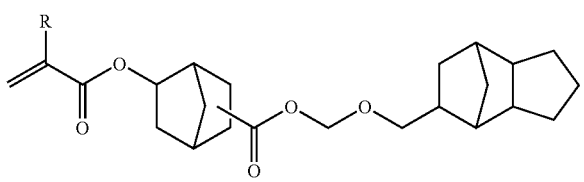
(4B-6)
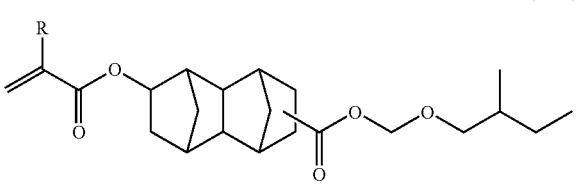
[Chemical Formula 22]
(4A-22)
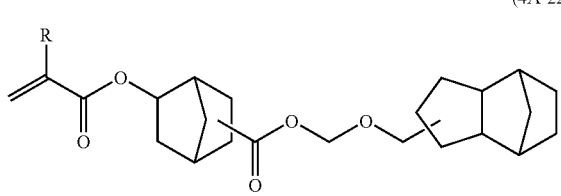
(4B-7)
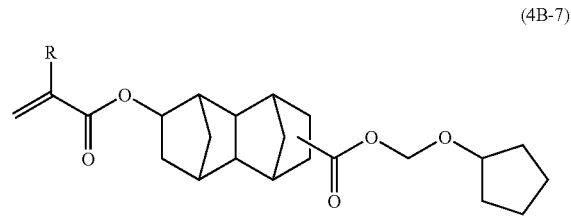

-continued
(4B-8)
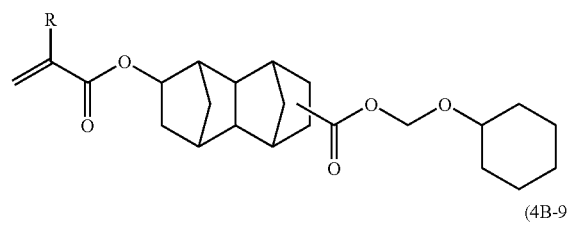
(4B-9)
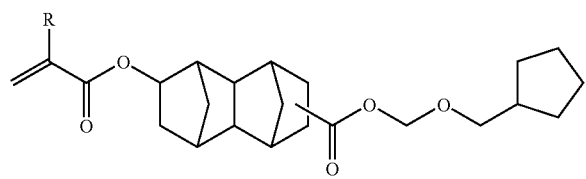
(4B-10)
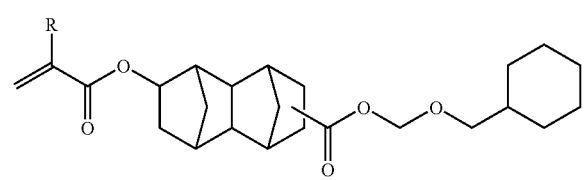
(4B-11)
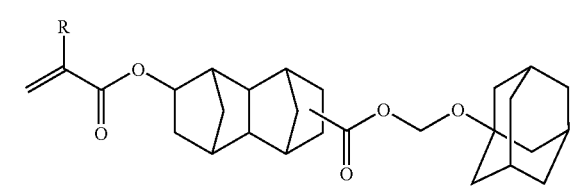
(4B-12)
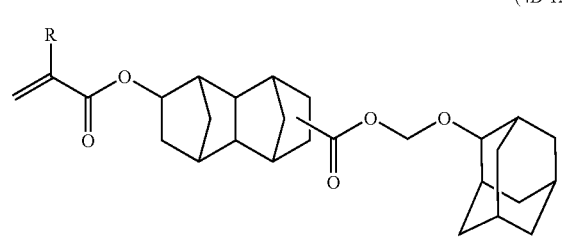
(4B-13)
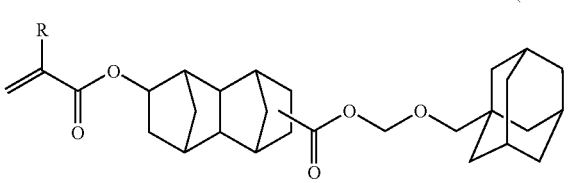
(4B-14)
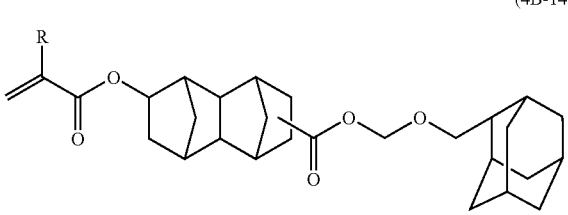
-continued
(4B-15)
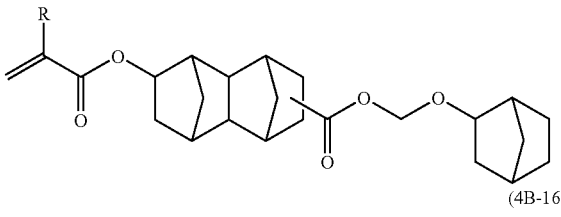
(4B-16)
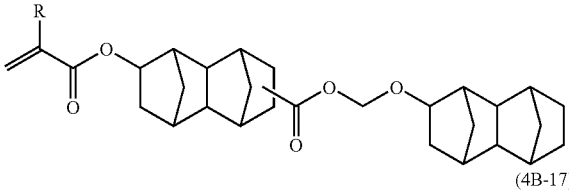
(4B-17)
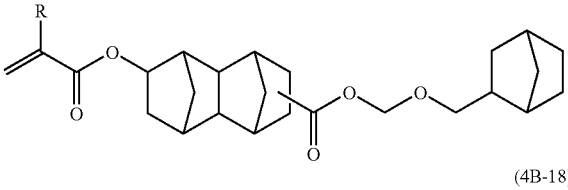
(4B-18)
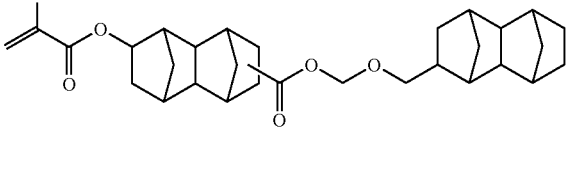
[Chemical Formula 23]
(4B-19)
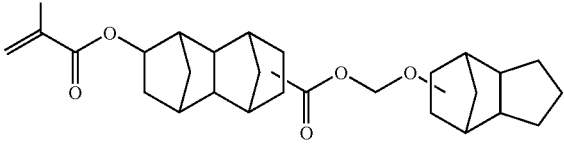
(4B-20)
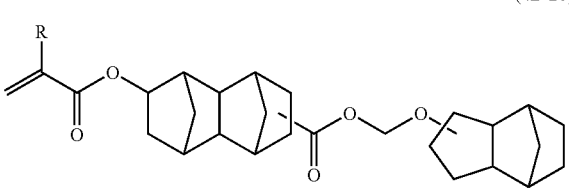
(4B-21)
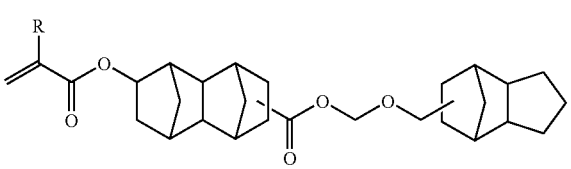

(4B-22)
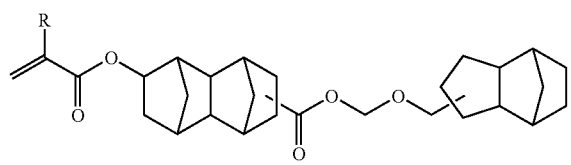

(4A-f)
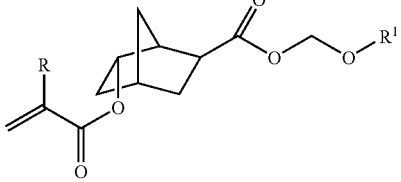

(4A-g)
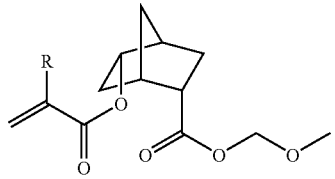

(4A-h)
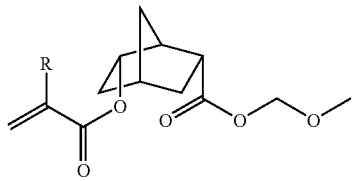

In the formulas (4A-1 to (4A-22) and (4B-1) to (4B-22) R represents a hydrogen atom or a methyl group.

Among these (meth)acrylates, (meth)acrylates represented by the formulas (4A-7), (4A-8), (4A-20), and (4B-8) are preferable because of excellent sensitivity when formed into the polymer for resist, and (meth)acrylates represented by the formulas (4A-1), (4A-2), (4B-1), and 4B-2) are particularly preferable in view of excellent line edge roughness.

Also (meth)acrylates represented by the formulas (4A-1) to (4A-22) and (4B-1) to (4B-22) have sometimes two or more position isomers and stereoisomers represented by the following formulas (4A-a) to (4A-h) and (4B-a) to (4B-x), and optical isomers thereof.

[Chemical Formula 24]

(4A-a)
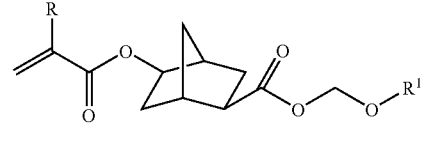

(4A-b)
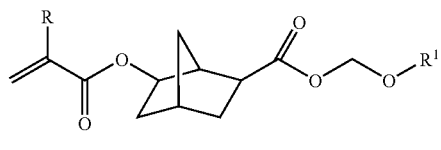

(4A-c)
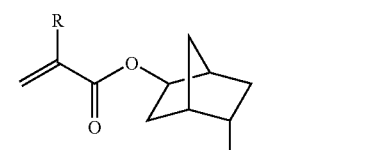

(4A-d)
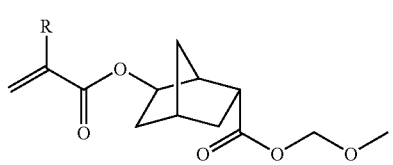

(4A-e)
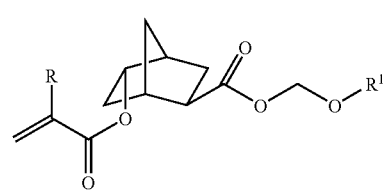

[Chemical Formula 25]

(4B-a)
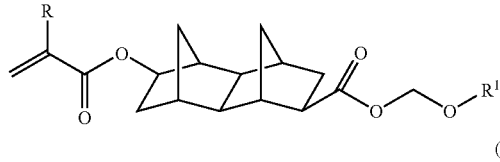

(4B-b)
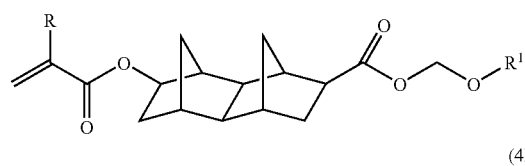

(4B-c)
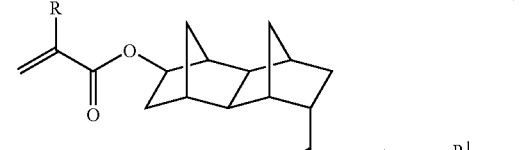

(4B-d)
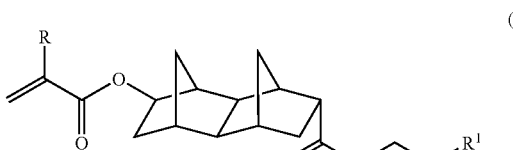

(4B-e)
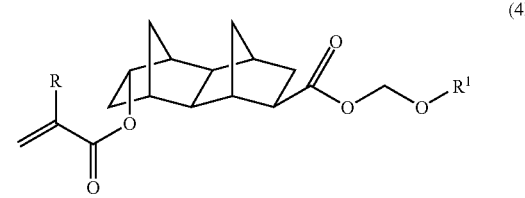

(4B-f) 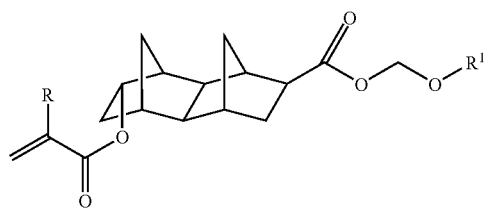
(4B-g) 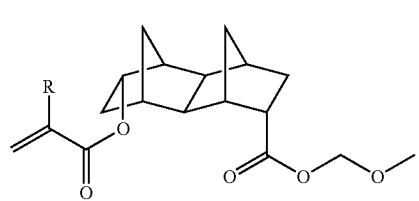
(4B-h) 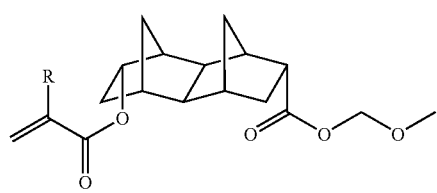
[Chemical Formula 26]
(4B-i) 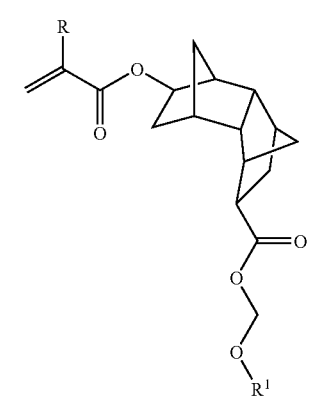
(4B-j) 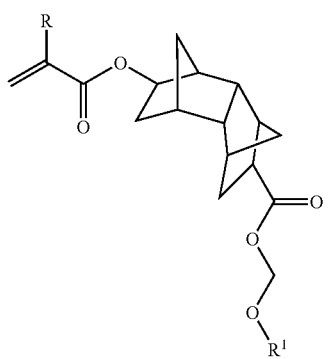
(4B-k) 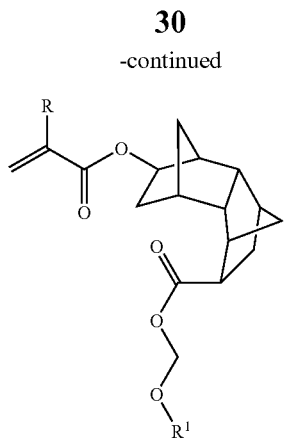
(4B-l) 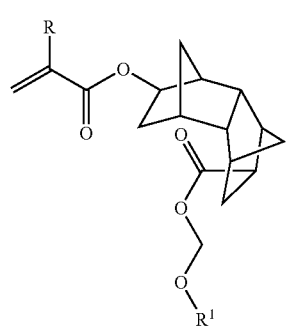
[Chemical Formula 27]
(4B-m) 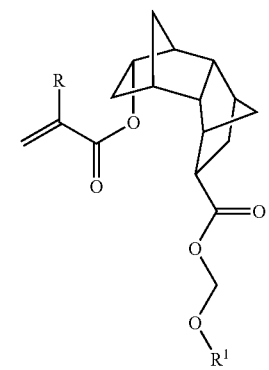
(4B-n) 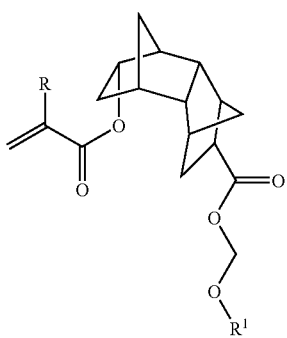

-continued
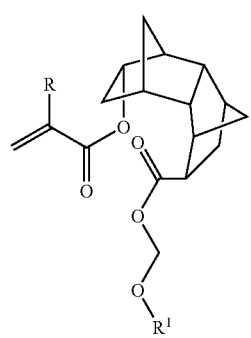
(4B-o)
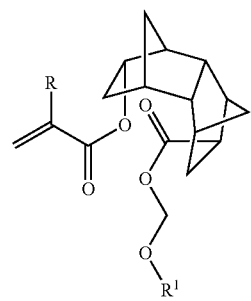
(4B-p)
[Chemical Formula 28]
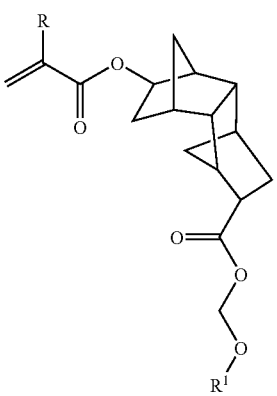
(4B-q)
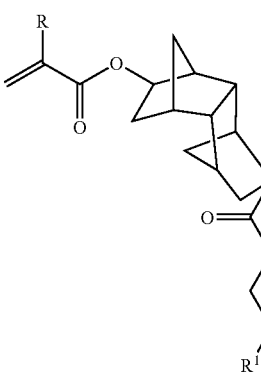
(4B-r)
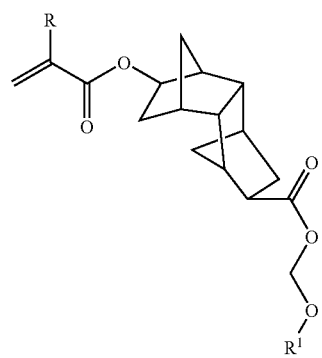
(4B-s)
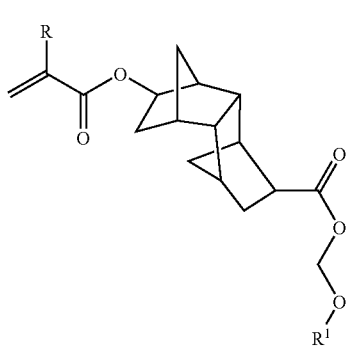
(4B-t)
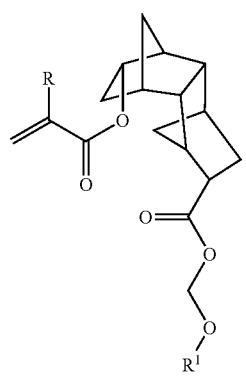
(4B-u)
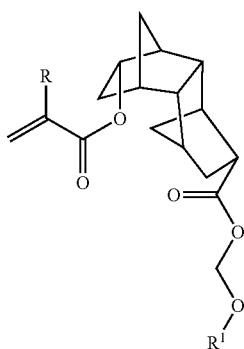
(4B-v)

(4B-w)

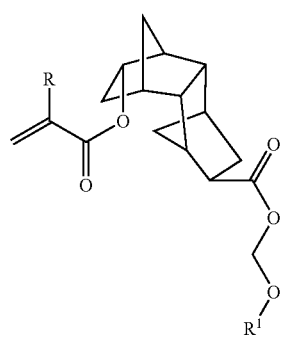

(4B-x)

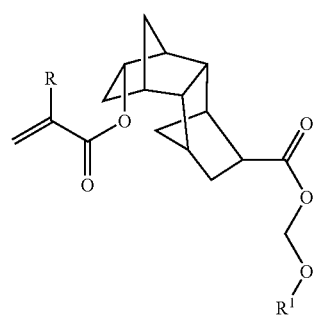

Among these isomers, (meth)acrylate represented by the formulas (4A) and (4B) may be an isomer alone, or a mixture of two or more isomers.

The monomers of the present invention can be produced, for example, by the following methods. The following steps (I) to (IV) are examples of the production steps of monomers represented by the formulas (3-22), (3-24), (3-5), and (3-46), and similar monomers other than these monomers can also be produced by the same steps.

[Chemical Formula 29]

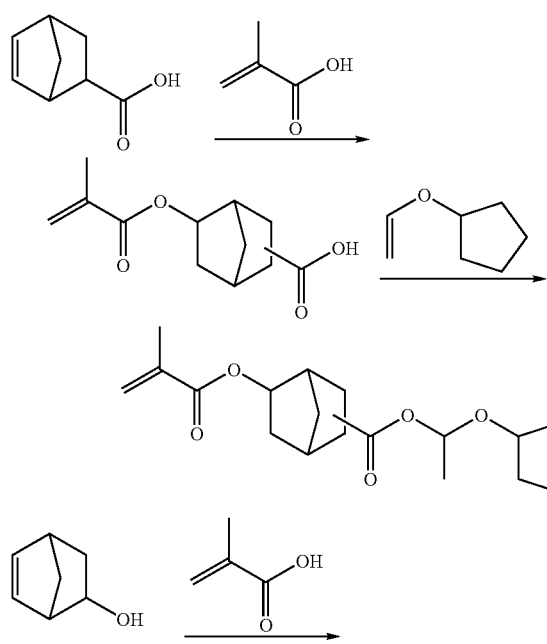

(I)

(II)

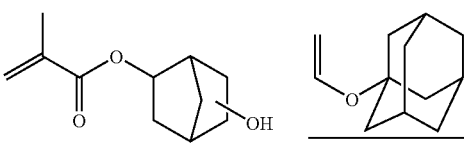

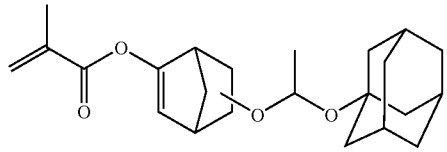

[Chemical Formula 30]

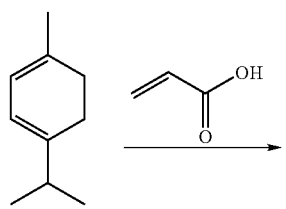

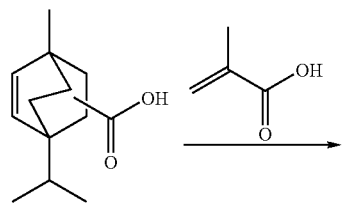

(III)

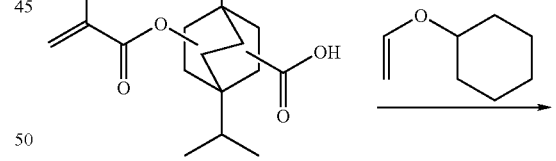

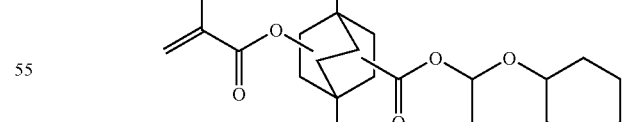

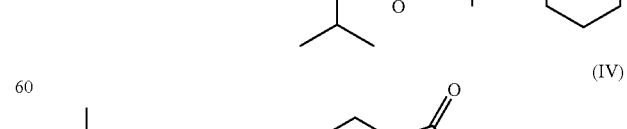

(IV)

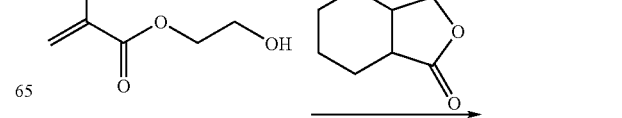

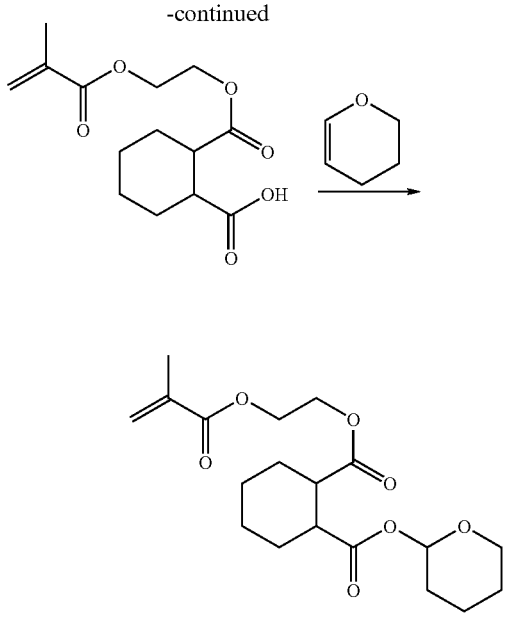

[Chemical Formula 31]

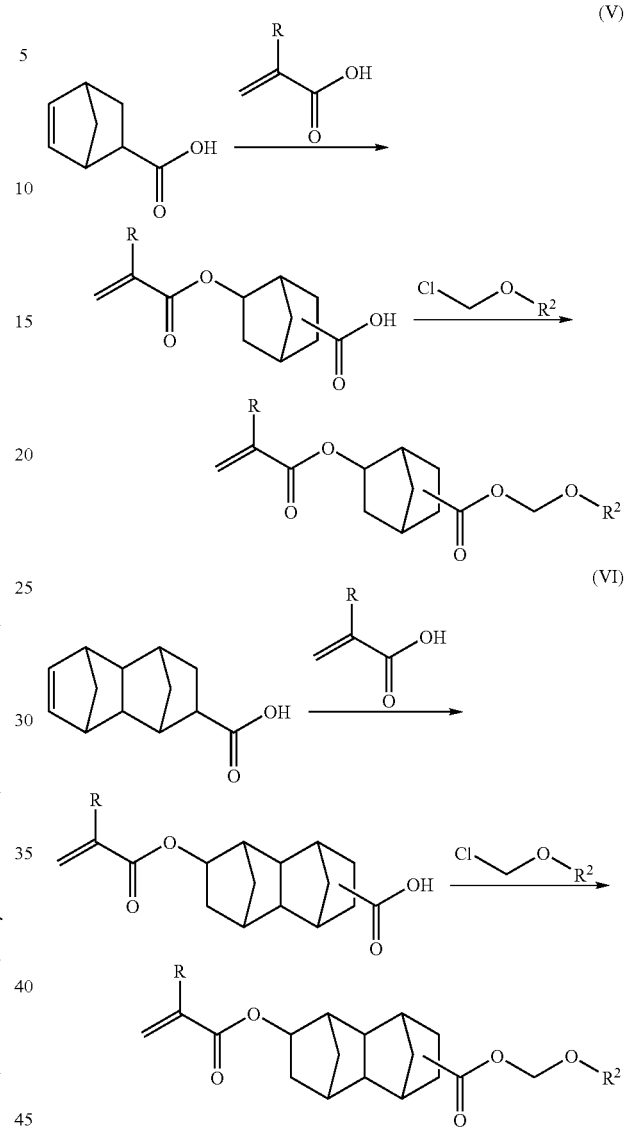

In the steps (I) and (II), norbornenecarboxylic acid and norbornene alcohol as raw materials can be synthesized by a known method, and commercially available products car also be used. The addition reaction of acrylic acid or methacrylic acid to nornenecarboxylic acid and norbornene alcohol is preferably conducted in the absence of a solvent or the presence of a solvent such as toluene, using an acid catalyst and using excess acrylic acid or methacrylic acid. Examples of the acid catalyst used in the addition reaction include, but are not limited to, hydrochloric acid, sulfuric acid, nitric acid, p-toluenesulfonic acid, methanesulfonic acid, acetic acid, trifluoroacetic acid, and trifluoromethanesulfonic acid. In view of the reaction rate, sulfuric acid, p-toluenesulfonic acid, and trifluoromethanesulfonic acid are preferable, and trifluoromethanesulfonic acid is more preferable. The addition reaction of carboxylic acid or alcohol to vinylether is preferably conducted in a solvent such as toluene or tetrahydrofuran using an acid catalyst.

In the step (III), commercially available terpinene as a raw material can be used. The cyclic addition reaction of terpinene and acrylic acid easily proceeds by a known method, and is preferably conducted in the absence of a solvent or the presence of a solvent such as methanol using a catalyst such as Lewis acid, if necessary. The subsequent addition reaction of acrylic acid or methacrylic acid and the addition reaction to vinylether can be used in the same manner as in the steps (I) and (II).

In the step (IV), commercially available hydroxyethyl methacrylate, hexahydrophthalic anhydride, and 2,3-dihydropyran as raw materials can be used. The reaction of ring-opening addition reaction of hydroxyethyl methacrylate to hexahydrophthalic anhydride easily proceeds by a known method and is preferably conducted in the absence of a solvent or the presence of a solvent such as methanol using a catalyst such as Lewis acid, if necessary. The subsequent addition reaction of carboxylic acid to 2,3-dihydropyran can be used in the same manner as in the steps (I) and (II).

(meth)acrylates represented by the formula (4A) and (4B) can be produced in the same manner as in the steps (V) and (VI).

In the steps (V) and (VI), norbornenecarboxylic acid and tetracyclo[4.4.0.1$^{2,5}$]dodecenecarboxylic acid as raw materials may be synthesized by a known method, and commercially available products may be used.

The first step is the addition step of (meth)acrylate to norbornenecarboxylic acid or tetracyclo[4.4.0.1$^{2,5}$]dodecenecarboxylic acid. When the addition reaction of (meth)acrylic acid is conducted excess (meth)acrylic acid is preferably used relative to norbornenecarboxylic acid or tetracyclo[4.4.0.1$^{2,5}$]dodecenecarboxylic acid in view of the reaction rate. The amount of the (meth)acrylic acid is preferably 2 mol or more, and more preferably 3 mol or more, based on 1 mol of norbornenecarboxylic acid or tetracyclo[4.4.0.1$^{2,5}$]dodecenecarboxylic acid. The amount of the (meth)acrylic acid is preferably 15 mol or less, and more preferably 8 mol or less. When the amount is less than the above range, the reaction may not proceed sufficiently. On the other hand, when the amount is more than the above range, it may become difficult to remove excess (meth)acrylic acid after the reaction.

The addition reaction of the (meth)acrylic acid is usually conducted in the presence of an acid catalyst. Examples of the acid catalyst include Lewis acid such as boron trifluoride; mineral acid such as sulfuric acid, hydrochloric acid, nitric acid, or phosphoric acid; organic acid such as p-toluenesulfonic acid, benzenesulfonic acid, dodecylbenzenesulfonic acid, methanesulfonic acid, camphorsulfonic acid, or trifluoromethanesulfonic acid; heteropoly acid such as phosphotungstic acid or tungstosilicic acid; and strong acidic ion-exchange resin. Among these acid catalysts, sulfuric acid, p-toluenesulfonic acid, camphorsulfonic acid, methanesulfonic acid, and trifluoromethanesulfonic acid are preferable because of high reactivity and methanesulfonic acid is particularly preferable because of easy handling. The amount of the acid catalyst is preferably 0.03 mol or more, more preferably 0.05 mol or more, preferably 0.3 mol or less, and more preferably 0.25 mol or less, based on 1 mol of norbornenecarboxylic acid. Then the amount is less than the above range, the acid addition reaction may not proceed sufficiently. On the other hand, when the amount is more than the above range, it may become difficult to conduct purification after the acid addition reaction. The temperature at which the acid addition reaction is conducted is preferably 50° C. or higher, more preferably 70° C. or higher preferably 180° C. or lower and more preferably 150° C. or lower. When the temperature is lower than the above range, the reaction may not proceed sufficiently. On the other hand, when the temperature is further lower the above range, by-product may increase.

Examples of the solvent used in the acid addition reaction include, but are not limited to, ether-based solvents such as tetrahydrofuran, tetrahydropyran, dimethylether, diethylether, diisopropylether, and methyl-t-butylether; aliphatic hydrocarbon-based solvents such as pentane, hexane, heptane, octane, and cyclohexane; and aromatic hydrocarbon-based solvents such as benzene, toluene, and xylene. It is preferred that these solvents are preliminarily dehydrated by a conventional method because high reaction yield is obtained. The acid addition reaction can also be conducted in the absence of a solvent and good yield can be attained. Therefore, the acid addition reaction is preferably conducted in the absence of a solvent.

The time of the acid addition reaction varies depending on the batch size, acid catalyst and reaction conditions, but is preferably 1 hour or more and 12 hours or less. More preferably, the time is 2 hours or more and 8 hours or less. When the time is less than the above range, the reaction may not proceed sufficiently. On the other hand, when the time is more than the above range, by-product may increase.

When the acid addition reaction is conducted, the polymerization sometimes occurs and therefore a polymerization inhibitor is preferably added. The polymerization inhibitor is not specifically limited as long as it can suppress the polymerization, and examples thereof include hydroquinone, hydroquinone monomethyl ether, 2,4-dimethyl-6-t-butylphenol, p-benzoquinone, 2,5-diphenyl-p-benzoquinone, phenothiazine, N-nitrosodiphenylamine, copper salt, metallic copper, and 2,2,6,6-tetramethylpiperidine-1-oxyl. It is also effective to suppress the polymerization by reacting while bubbling an air or oxygen.

After the completion of the acid addition reaction, the acid catalyst can be removed by a method of removing an acid catalyst by washing or neutralizing and washing the reaction solution with an aqueous alkali solution of sodium hydroxide, potassium hydroxide, sodium carbonate, sodium hydrogen carbonate, or the like; a method of removing an acid catalyst by adding an alkali powder of sodium carbonate, sodium hydrogen carbonate, magnesium oxide, or the like, followed by stirring and further filtration of a neutral salt; or a method of neutralizing an acid catalyst by adding an amine such as triethylamine triethanolamine, morpholine, or the like. Among these methods, a method of washing with an aqueous alkali solution and extracting with an organic solvent is preferable because the acid catalyst can be effectively removed. Examples of the organic solvent, which can be used for reaction, include toluene, benzene, hexane, cyclohexane, ethyl acetate, diethylether, and diisopropylether. Among these solvents, toluene, ethyl acetate, and diethylether are preferable because extraction efficiency is high and the amount of the solvent can be decreased, and toluene is particularly preferable because purity of the objective compound can be increased.

The resulting (meth)acrylic acid adduct may be purified by a known method such as distillation or column chromatography, and may be used in the following step without being purified. Since the (meth)acrylic acid adduct may be polymerized by heating, purification is not preferably conducted because the entire yield increases.

The following step is an alkoxymethyletherification step of a carboxy group of a (meth)acrylic acid adduct. The alkoxymethyletherification is conducted by reacting the (methacrylic acid adduct with a halogenated alkylether or dialkoxymethane in the presence of a base. Also the (meth) acrylic acid adduct may be reacted with for aldehyde and an alcohol may be reacted. In view of the reaction rate, it is preferred to react with a halogenated alkylether. Because of less by-product, chloroalkylether is particularly preferable. The base is not specifically limited, and triethylamine, diisopropylethylamine pyridine, dimethylaminopyridine, sodium hydride, lithium hydride potassium t-butoxide, sodium methoxide, and sodium ethoxide are used. The reaction solvent is not specifically limited, but a polar solvent such as methanol ethanol tetrahydrofuran, formamide, acetamide, dimethyl formamide, dimethyl acetamide, or dimethyl sulfoxide are preferably used in view of the reaction rate, and dimethyl form amide is particularly preferable. The temperature at which the alkoxymethyletherification is conducted is preferably −50° C. or higher, more preferably 0° C. or higher, preferably 100° C. or lower, and more preferably 50° C. or lower. When the temperature is lower than the above range, the reaction may not proceed sufficiently. On the other hand, when the temperature is further lower than the above range, by-product may increase.

The resulting (meth)acrylate of the present invention can be used as a raw material of the polymer without being purified, but it is preferably purified so as to suppress contamination of the polymer with impurities. The purification can be conducted by a known method such as column chromatography, distillation, or recrystallization and is preferably conducted by distillation because of easy handling. Since the polymerization sometimes occurs during the distillation, a polymerization inhibitor is preferably added. The polymerization inhibitor is not specifically limited as long as it suppresses the polymerization, and examples thereof include hydroquinone, hydroquinonemonomethylether 2,4-dimethyl-6-t-butylphenol, p-benzoquinone, 2,5-diphenyl-p-benzoquinone, phenothiazine, N-nitrosodiphenylamine, copper salt, metallic copper, 2,2,6,6-tetramethylpiperidine-1-oxyl. It is also effective to suppress the polymerization by distillation while bubbling an air or oxygen.

When heated during distillation, the (methacrylate of the present invention is sometimes decomposed. The reason is considered that an acidic component used in the reaction remains and elimination of an acid-eliminating group occurs. In order to suppress the decomposition, distillation may be conducted by adding a base. The base is not specifically limited, but is preferably sodium hydroxide or potassium hydroxide because of easy handling.

The (meth)acrylate of the present invention can be produced according to the scheme shown in the following steps (VII) and (VIII).

[Chemical Formula 32]

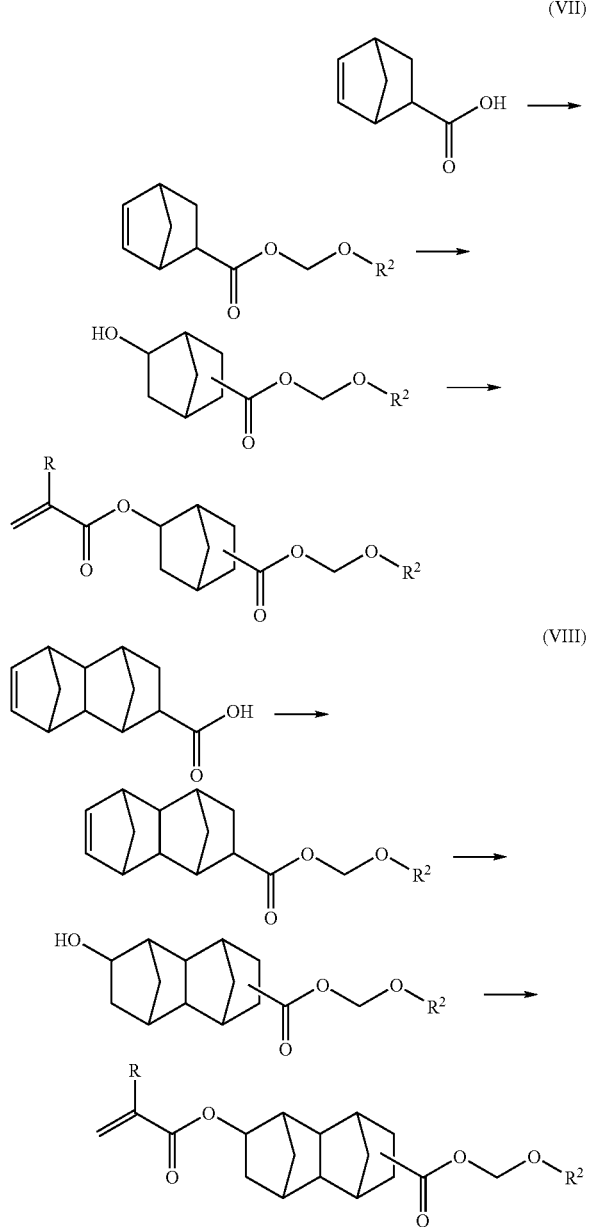

The first step is an alkoxymethyletherification step of norbornenecarboxylic acid or tetracyclo[4.4.0.1$^{2,5}$]dodecenecarboxylic acid. The alkoxymethyletherification is conducted by reacting norbornenecarboxylic acid with a halogenated alkylether or dialkoxymethane in the presence of a base. Also the (meth)acrylic acid adduct, and formaldehyde and an alcohol may be reacted.

The second step is a hydroxylation step to an alkoxymethyletherified compound. The alkoxymethyletherified compound and formic acid and a BH$_3$-tetrahydrofuran complex are reacted and then hydrolyzed with a base such as sodium carbonate to obtain an alcohol compound.

Furthermore, the resulting alcohol compound and (meth)acrylic acid chloride are dehydrochlorinated in the presence of a base such as sodium hydroxide to obtain a (meth)acrylate of the present invention.

Also it can be produced according to the scheme shown in the following steps (IX) and (X) in which the step order was replaced as compared with the steps (VII) and (VIII).

[Chemical Formula 33]

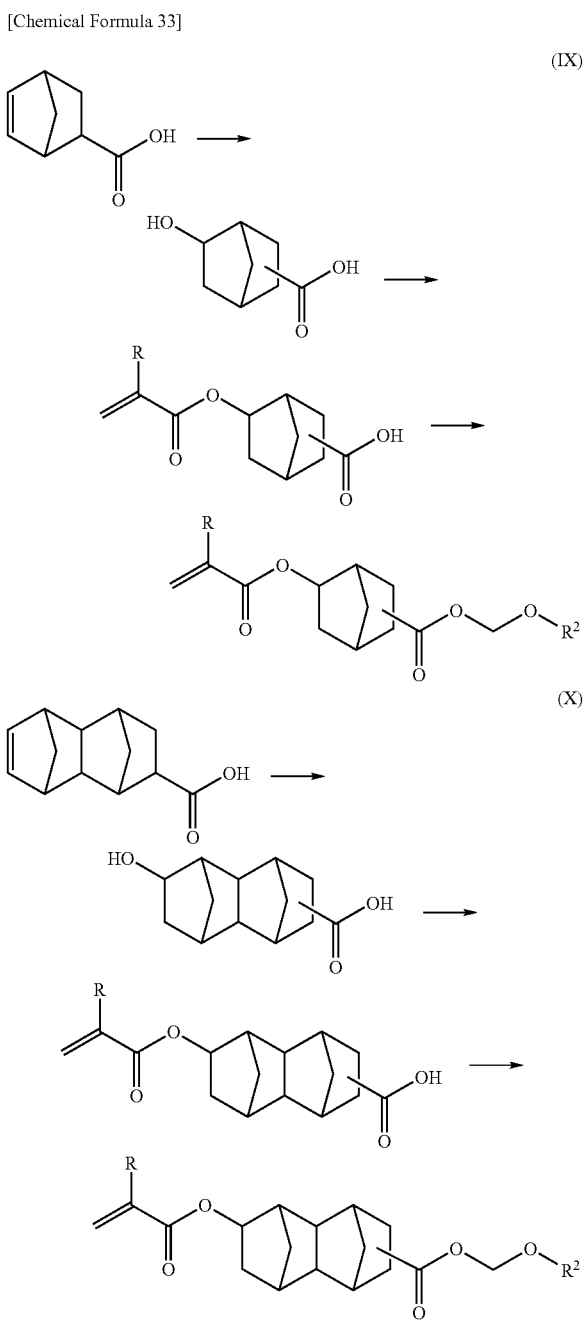

The products of the steps (I) to (X) sometimes contain some positional isomers, geometrical isomers, and optical isomers. As the raw material of the constituent unit (1) of the polymer of the present invention, a mixture of two or more kinds of isomers may be used, or any isomer may be used alone after the purification. Therefore, the mixture of isomers can be used for the polymerization reaction as it is. Even if the mixture contains a reaction intermediate, it can be used for the polymerization reaction as it is. The product of the reaction may be purified by simple distillation, thin film distillation, recrystallization, or column chromatography, if necessary.

The polymer of the present invention may be a homopolymer or a copolymer.

When the polymer of the present invention is used as a positive resist material, it is preferred to copolymerize a monomer represented by the formula (3) of the present invention with compounds represented by the following formulas (6-1) to (6-80) because of excellent resist performances such as sensitivity resolution and etching resistance. As the copolymerizable component, any monomer can be used according to the purposes and also a copolymerization ratio may be decided according to the purposes. In the formulas (6-1) to (6-80), R represents a hydrogen atom or a methyl group.

[Chemical Formula 34]

(6-1)

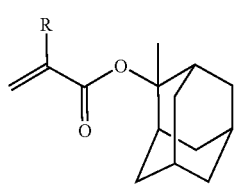

(6-2)

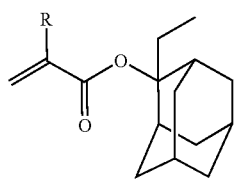

(6-3)

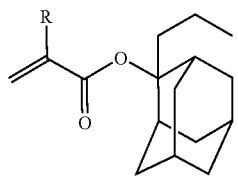

(6-4)

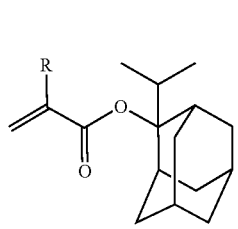

(6-5)

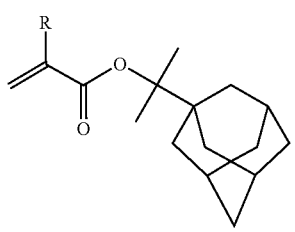

-continued (6-6)

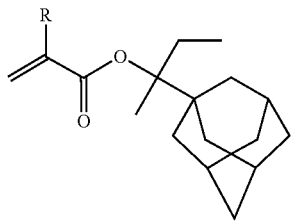

(6-7)

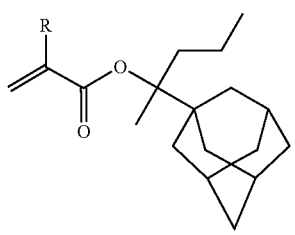

(6-8)

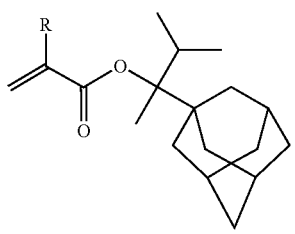

(6-9)

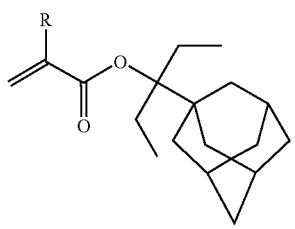

(6-10)

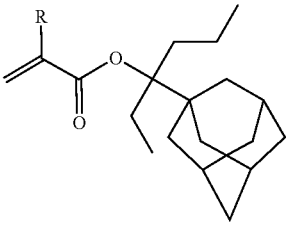

(6-11)

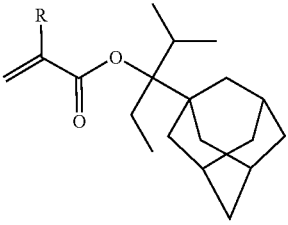

(6-12)

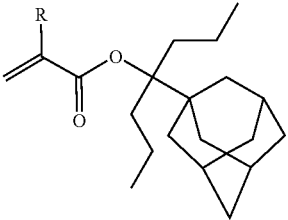

(6-13) 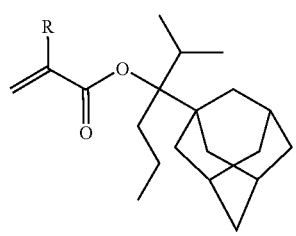
(6-14) 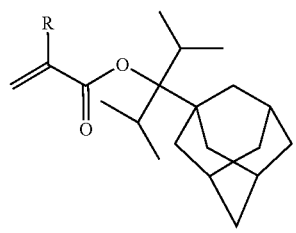
(6-15) 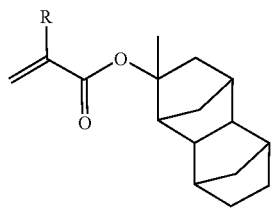
(6-16) 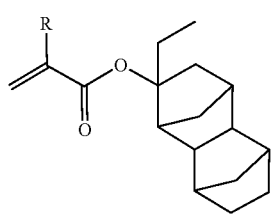
(6-17) 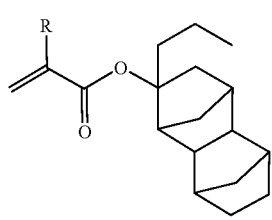
(6-18) 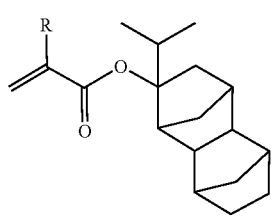
(6-19) 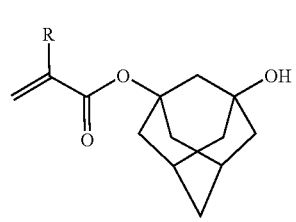
(6-20) 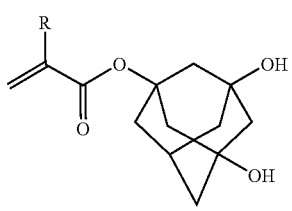
(6-21) 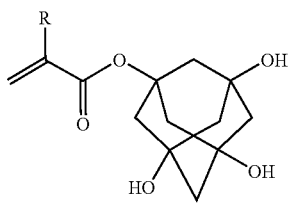
(6-22) 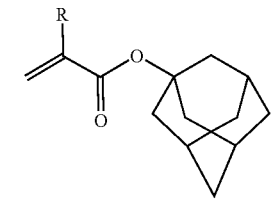
[Chemical Formula 35]
(6-23) 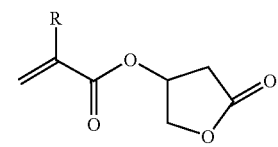
(6-24) 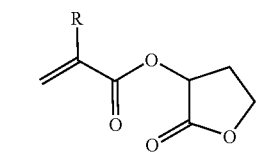
(6-25) 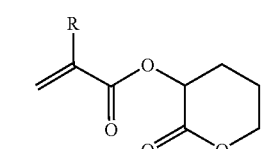
(6-26) 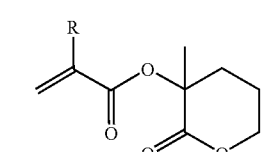
(6-27) 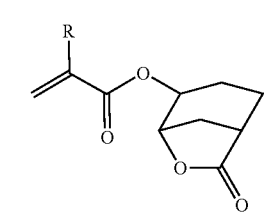

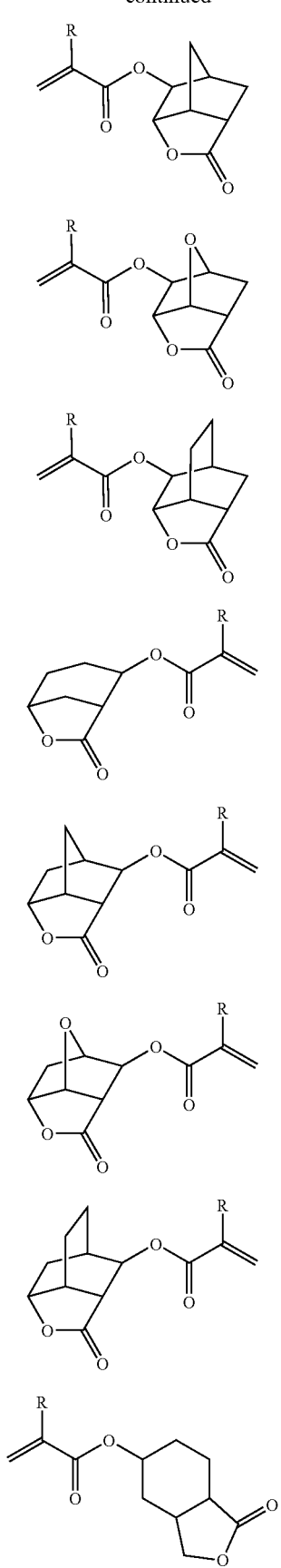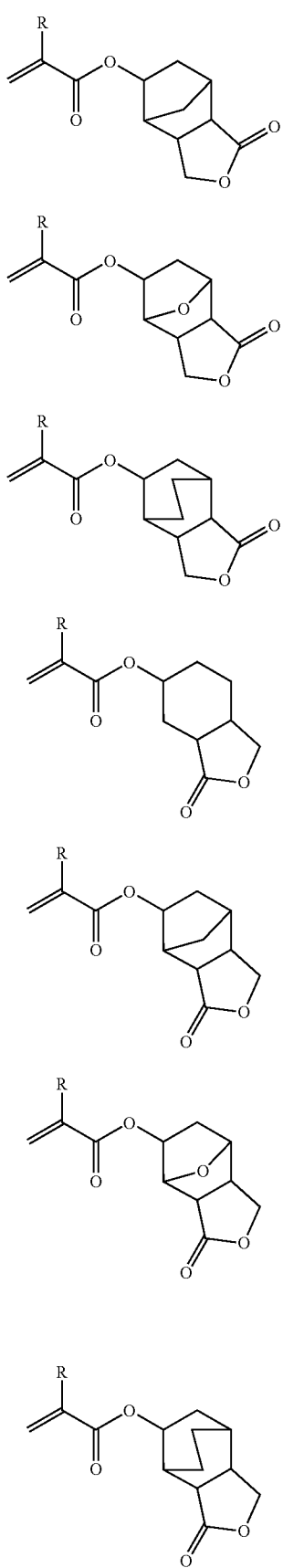

(6-43) 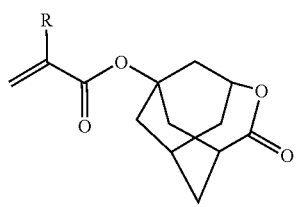
(6-44) 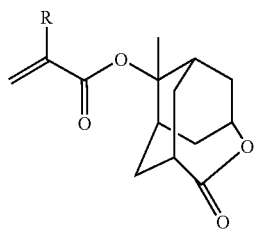
(6-45) 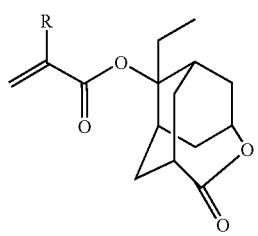
(6-46) 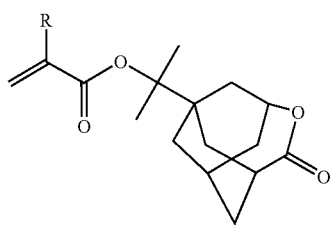
[Chemical Formula 36]
(6-47) 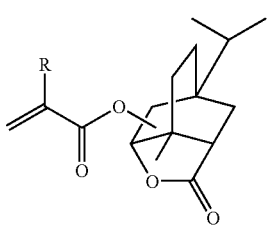
(6-48) 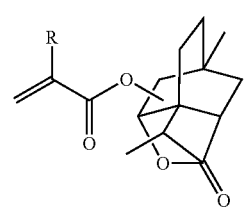
(6-49) 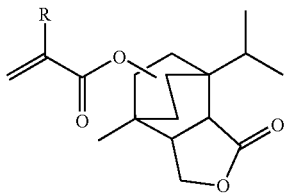
(6-50) 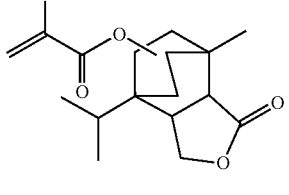
(6-51) 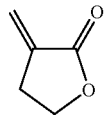
(6-52) 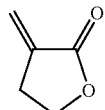
(6-53) 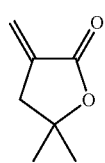
(6-54) 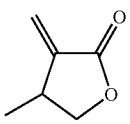
(6-55) 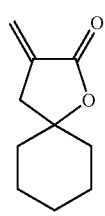
(6-56) 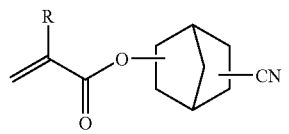
(6-57) 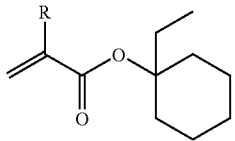

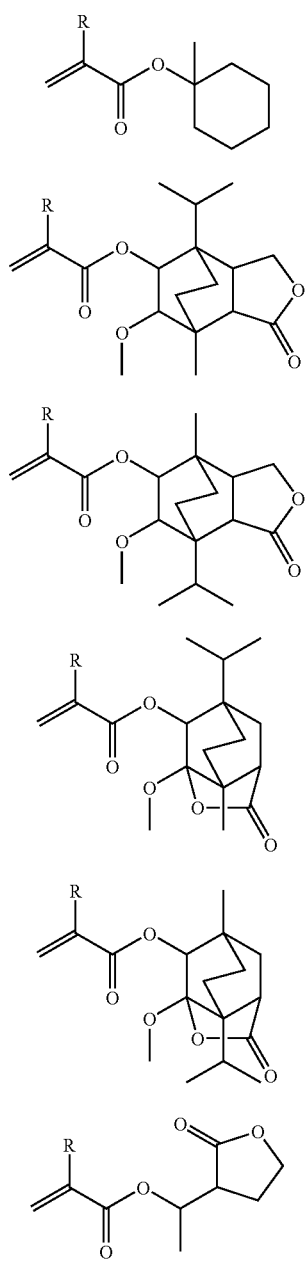
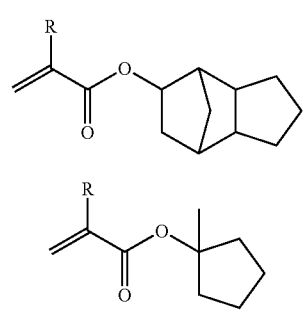
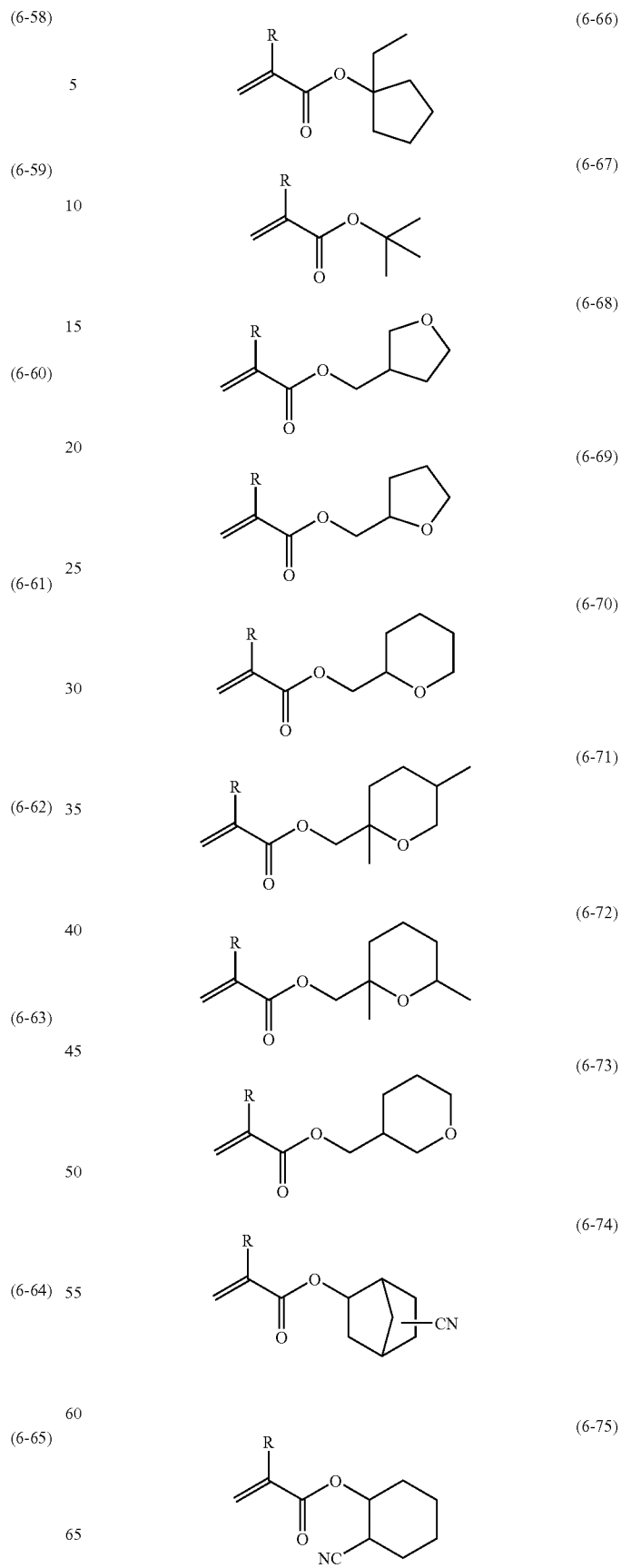

-continued

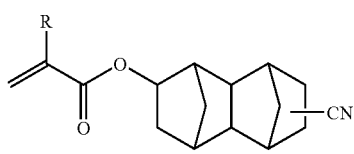
(6-76)

[Chemical Formula 38]

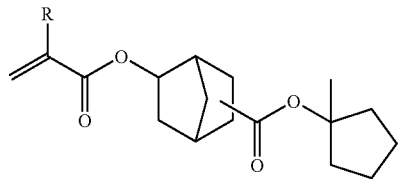
(6-77)

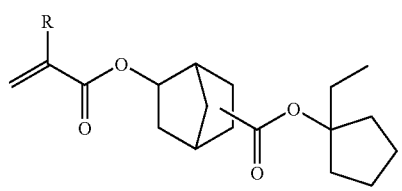
(6-78)

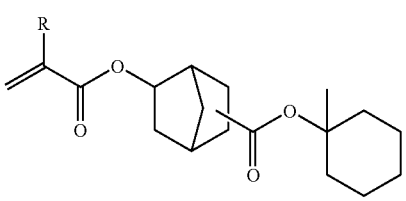
(6-79)

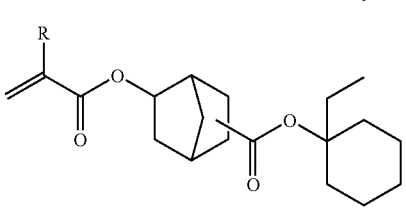
(6-80)

The monomers described above can be used alone or in combination, if necessary.

When the polymer of the present invention is used as a resist composition the proportion of the constituent unit represented by the formula (1) in the polymer is preferably from 20 to 60 mol %, and more preferably from 30 to 50 mol %, because of excellent sensitivity and resolution, and small line edge roughness.

In view of excellent sensitivity and resolution, a monomer represented by the formula (3) is preferably copolymerized with one or more monomers selected from the group consisting of monomers represented by the formulas (6-1), (6-2), (6-16), (6-57), (6-58), and (6-65) to (6-67). The polymer obtained by copolymerizing these monomers is made soluble in an alkali developing solution by decomposing through an action of an acid. Therefore, a positive resist using the polymer is excellent in sensitivity and resolution.

In view of excellent substrate adhesion, a monomer represented by the formula (3) is preferably copolymerized with one or more monomers selected from the group consisting of monomers represented by the formulas (6-23), (6-24), (6-28), (6-29), (6-36), (6-47), (6-59), and (6-63). These monomers have a lactone structure in the molecule and a polymer obtained by copolymerizing these monomers is excellent in substrate adhesion.

Because of excellent pattern shape, a monomer represented by the formula (3) is preferably copolymerized with one or more monomers selected from the group consisting of monomers represented by the formulas (6-19) and (6-74). A positive resist using a polymer containing alicyclic skeleton having a hydroxy group or a cyano group is excellent in pattern shape.

In view of excellent etching resistance, a monomer represented by the formula (3) is preferably copolymerized with one or more monomers selected from the group consisting of monomers represented by the formulas (6-22) and (6-64).

Among the copolymers described above, a copolymer comprising 25 to 70 mol % of a constituent unit represented by the formula (1), 25 to 70 mol % of a constituent unit derived from one or more monomers selected from the group consisting of monomers represented by the formulas (6-23), (6-24), (6-28), (6-29), (6-36), (6-47), (6-59), and (6-63), 5 to 20 mol % of a constituent unit derived from one or more monomers selected from the group consisting of monomers represented by the formulas (6-19) and (6-74) is particularly excellent in view of excellent sensitivity, resolution, and line edge roughness.

In the polymer of the present invention, each constituent unit can take optional sequence. Therefore, the polymer of the present invention may be a random copolymer, an alternating copolymer, or a block copolymer.

The monomer represented by the formula (3) can also be copolymerized with the other monomer. Specific examples thereof include (meth)acrylates having a linear or branched structure, such as methyl(meth)acrylate, ethyl(meth)acrylate, 2-ethylhexyl (meth)acrylate, n-propyl(meth)acrylate, isopropyl(meth)acrylate, butyl(meth)acrylate, isobutyl(meth)acrylate, t-butyl(meth)acrylate, methoxymethyl(meth)acrylate, n-propoxyethyl (meth)acrylate, i-propoxyethyl(meth)acrylate n-butoxyethyl(meth)acrylate, i-butoxyethyl(meth)acrylate, t-butoxyethyl(meth)acrylate, 2-hydroxyethyl(meth)acrylate, 3-hydroxypropyl(meth)acrylate, 2-hydroxy-n-propyl(meth)acrylate, 4-hydroxy-n-butyl (meth)acrylate, 2-ethoxyethyl(meth)acrylate, 1-ethoxyethyl(meth)acrylate, 2,2,2-trifluoroethyl(meth)acrylate, 2,2,3,3-tetrafluoro-n-propyl(meth)acrylate, 2,2,3,3,3-pentafluoro-n-propyl(meth) acrylate, methyl α-(tri)fluoromethyl acrylate, ethyl a (tri)fluoromethyl acrylate, 2-ethylhexyl α-(tri)fluoromethyl acrylate, n-propyl a (tri)fluoromethyl acrylate, i-propyl α-(tri)fluoromethyl acrylate, n-butyl α-(tri)fluoromethyl acrylate, i-butyl α-(tri)fluoromethyl acrylate, t-butyl α-(tri) fluoromethyl acrylate, methoxymethyl α-(tri)fluoromethyl acrylate, and ethoxyethyl α-(tri)fluoromethyl acrylate, aromatic alkenyl compounds such as styrene, α-methylstyrene, vinyltoluene, p-hydroxystyrene, p-t-butoxycarbonylhydroxystyrene, 3,5-di-t-butyl-4-hydroxystyrene, 3,5-dimethyl-4-hydroxystyrene, p-t-perfluorobutylstyrene, and p-(2-hydroxy-i-propyl)styrene; unsaturated carboxylic acids and carboxylic danhydrides, such as (meth)acrylic acid, maleic acid, maleic anhydride, itaconic acid, and itaconic anhydride, and ethylene, propylene, norbornene, tetrafluoroethylene, acrylamide, N-methylacrylamide, N,N-dimethylacrylamide, vinyl chloride, ethylene, vinyl fluoride, vinylidene fluoride, tetrafluoroethylene, and vinyl pyrrolidone.

The mass average molecular weight of the polymer of the present invention is not specifically limited, and is preferably 1,000 or more, and more preferably 1,000,000 or less. When the polymer of the present invention is used as a positive resist material, the mass average molecular weight of the polymer is preferably 1,000 or more, more preferably 2,000 or more, and particularly preferably 5,000 or more in view of etching resistance and resist shape. The mass average molecular weight of the polymer of the present invention is preferably 100,000 or less, more preferably 50,000 or less, and particularly preferably 20,000 or less in view of solubility and resolution to a resist solution.

The polymer of the present invention can be produced by polymerizing a monomer represented by the formula (3). Examples of the polymerization method include radical polymerization, anion polymerization, and cation polymerization methods. When it is necessary to control the molecular weight, molecular weight distribution, and stereoregularity a polymerization method referred to precision polymerization typified by living polymerization.

In general, examples of the production process for obtaining a polymer include bulk polymerization process, suspension polymerization process, emulsion polymerization process, vapor phase polymerization process, and solution polymerization process. These production processes may be appropriately decided according to properties of the objective polymer. It is necessary to remove the monomer remained after the completion of the polymerization reaction and the molecular weight of the copolymer is comparatively decreased so as not to decrease light transmittance and therefore a solution polymerization process among the above processes is often employed. Among the solution polymerization processes, a drop polymerization method of adding dropwise a monomer solution, which is prepared by preliminarily dissolving a monomer and a polymerization initiator in an organic solvent, in an organic solvent maintained at a fixed temperature is preferably employed because the average molecular weight and molecular weight distribution slightly vary with the kind of a production batch and a reproducible copolymer is easily obtained.

The polymer of the present invention is usually obtained by polymerize a monomer solution containing a monomer represented by the formula (3) in the presence of a polymerization initiator. In the polymerization using a polymerization initiator, first, a radical compound of a polymerization initiator is produced in the reaction solution and chain polymerization of the monomer proceeds in the presence of this radical compound as an origin.

The polymerization initiator used in the production of the polymer of the present invention is preferably a polymerization initiator which efficiently generates a radical by heat. Examples of the polymerization initiator include azo compounds such as 2,2'-azobisisobutyronitrile and dimethyl-2,2'-azobisisobutyrate; and organic peroxides such as 2,5-dimethyl-2,5-bis(tert-butylperoxy)hexane.

When the polymer of the present invention is produced, a chain transfer agent may be used. A polymer having a low molecular weight and small molecular weight distribution can be produced by using the chain transfer agent. Examples of preferable chain transfer agents include 1-butanethiol, 2-butanethiol, 1-octanethiol (n-octylmercaptan), 1-decanethiol, 1-tetradecanethiol, cyclohexanethiol, 2-methyl-1-propanethiol, 2-mercaptoethanol, mercaptoacetic acid, and 1-thioglycerol.

The amount of the polymerization initiator is not specifically limited, but is preferably from 1 to 20 mol % based on the entire amount of the monomer used. The amount of the chain transfer agent is not specifically limited, but is preferably from 1 to 20 mol % based on the entire amount of the monomer used.

The polymerization temperature is not specifically limited, but is preferably 50° C. or higher and 150° C. or lower.

When the monomer, the polymerization initiator and the resulting polymer and the chain transfer agent are used in combination, the organic solvent used in the solution polymerization process is preferably a solvent capable of dissolving any chain transfer agent Examples of the organic solvent include 1,4-dioxane, isopropyl alcohol, acetone, tetrahydrofuran (hereinafter also referred to as "THF") methyl isobutyl ketone, γ-butyrolactone, and propylene glycol monomethyl ether acetate (hereinafter also referred to as "PGMEA"), and ethyl lactate.

The polymer solution produced by the method such as solution polymerization may be optionally purified by diluting with a good solvent such as 1,4-dioxane, acetone, THF, methyl isobutyl ketone, γ-butyrolactone, PGMEA, or ethyl lactate to obtain a solution having proper viscosity, and adding dropwise the solution in a large amount of a poor solvent such as methanol or water, thereby precipitating a polymer. This step is generally referred to as a reprecipitation step and is very effective to remove the unreacted monomer and the polymerization initiator remained in the polymerization solution. The precipitate was filtered and sufficiently dried to obtain a polymer of the present invention. After filtration, a wet powder can be used without being dried.

2. Resist Composition of the Present Invention

The resist composition of the present invention will now be described.

The resist composition of the present invention is obtained by dissolving the polymer of the present invention in a solvent. The chemically amplified photoresist composition of the present invention is obtained by dissolving the polymer of the present invention and the photo acid generator in a solvent. The chemically amplified positive resist is excellent in sensitivity. These polymers of the present invention may be used alone or in combination. The polymer of the present invention may be used as a blend polymer mixed with the other polymer. The polymer solution can be used as it is in a resist composition without separating a polymer from the polymer solution through solution polymerization. Alternatively, this polymer solution can be used in the resist composition alter being diluted with a suitable solvent. The resist composition of the present invention may contain a polymer other than the polymer of the present invention.

In the resist composition of the present invention, the solvent capable of dissolving the polymer of the present invention can be optionally selected.

Examples of the solvent include linear or branched ketones such as methyl ethyl ketone, methyl isobutyl ketone, and 2-pentanone; cyclic ketones such as cyclopentanone and cyclohexanone; propylene glycol monoalkyl acetates such as propylene glycol monomethyl ether acetate; ethylene glycol monoalkyl ether acetates such as ethylene glycol monomethyl ether acetate; propylene glycol monoalkyl ethers such as propylene glycol monomethyl ether; ethylene glycol monoalkyl ethers such as ethylene glycol monomethyl ether; diethylene glycol alkyl ethers such as diethylene glycol dimethyl ether; esters such as ethyl acetate and ethyl lactate; alcohols such as n-propyl alcohol, isopropyl alcohol, n-butyl alcohol, and tert-butyl alcohol; 1,4-dioxane, ethylene carboxylate, and γ-butyrolactone. These solvents may be used alone or in combination.

The content of the solvent is preferably 200 parts by mass or more, and more preferably 300 parts by mass or more, based on 100 parts by mass of the polymer for resist. The content of the solvent is preferably 5,000 parts by mass or less, and more preferably 2,000 parts by mass or less, based on 100 parts by mass of the polymer for resist.

When the polymer of the present invention is used in a chemically amplified positive resist, it is necessary to use a photo acid generator.

The photo acid generator contained in the chemically amplified photoresist composition of the present invention can be optionally selected from those which can be used as an acid generator of the chemically amplified photoresist composition. These photo acid generators may be used alone or in combination.

Examples of the photo acid generator include onium salt compounds, sulfonimide compounds, sulfone compounds, sulfonate compounds, quinonediazide compounds, and diazomethane compounds. As the photo acid generator, onium salt compounds such as sulfonium salt, iodonium salt, phosphonium salt, diazonium salt, and pyridinium salt are preferable, and specific examples thereof include triphenylsulfonium triflate, triphenylsulfonium hexafluoroantimonate, triphenylsulfonium naphthalenesulfonate (hydroxyphenyl) benzylmethylsulfonium toluenesulfonate, diphenyliodonium triflate, diphenyliodonium pyrenesulfonate, diphenyliodonium dodecylbenzenesulfonate, diphenyliodonium hexafluoroantimonate, p-methylphenyldiphenylsulfonium nonafluorobutanesulfonate, and tri(tert-butylphenyl)sulfonium trifluoromethanesulfonate.

The content of the photo acid generator is appropriately decided according to the kind of the selected photo acid generator, and is preferably 0.1 parts by mass or more, and more preferably 0.5 parts by mass or more based on 100 parts by mass of the polymer for positive resist. By adjusting the content of the photo acid generator within the above range, it is possible to sufficiently cause the chemical reaction through a catalytic action of the acid generated under exposure. The content of the photo acid generator is preferably 20 parts by mass or less, and more preferably 10 parts by mass or less, based on 100 parts by mass of the polymer for positive resist. By adjusting the content of the photo acid generator within the above range, stability of the resist composition is improved and the occurrence of coating unevenness in the case of coating the composition and scum on development is sufficiently suppressed.

Furthermore, the chemically amplified photoresist composition of the present invention can be mixed with a nitrogen-containing compound. By mixing the nitrogen-containing compound, resist pattern shape and post exposure stability of the latent image formed by the pattern wise exposure of the resist layer are further improved. Namely, the resulting resist pattern has nearly rectangular profile. Although a resist film is exposed, subjected to post exposure baking (PEB) and then allowed to stand for several hours before the following development treatment in a mass production line of semiconductors, deterioration of the resist pattern profile caused when the resist film is allowed to stand (with a lapse of time) is more suppressed.

As the nitrogen-containing compound any known nitrogen-containing compound can be used. Among these nitrogen-containing compounds, an amine is preferable, and a secondary lower aliphatic amine and a tertiary lower aliphatic amine are more preferable.

As used herein, "lower aliphatic amine" means an amine of an alkyl or alkyl alcohol having 5 carbon atoms or less.

Examples of the secondary lower aliphatic amine and the tertiary lower aliphatic amine include trimethylamine, diethylamine, triethylamine, di-n-propylamine, tri-n-propylamine, tripentylamine, diethanolamine, and triethanolamine. As the nitrogen-containing compound, a tertiary alkanol amine such as triethanolamine is more preferable.

These nitrogen-containing compounds may be used alone or in combination. The content of the nitrogen-containing compound is appropriately decided according to the kind of the selected nitrogen-containing compound, but is preferably 0.01 parts by mass or more based on 100 parts by mass of the polymer for positive resist. By adjusting the content of the nitrogen-containing compound within the above range, the resulting resist pattern shape can have nearly rectangular profile. The content of the nitrogen-containing compound is preferably 2 parts by mass or less based on 100 parts by mass of the polymer for positive resist. By adjusting the content of the nitrogen-containing compound within the above range, deterioration of sensitivity can be suppressed.

The chemically amplified photoresist composition of the present invention can also be mixed with an organic carboxylic acid, oxo acid of phosphorus, or a derivative thereof. By mixing with these compounds, deterioration of sensitivity caused by mixing the nitrogen-containing compound can be prevented, and also resist pattern shape and post exposure stability of the latent image formed by the pattern wise exposure of the resist layer are further improved.

As the organic carboxylic acid, for example, malonic acid, citric acid, malic acid, succinic acid, benzoic acid, and salicylic acid are preferable. Examples of the oxo acid of phosphorus, or derivative thereof include phosphoric acid and derivative thereof such as ester, for example, phosphoric acid, di-n-butyl phosphate, or diphenyl phosphate; phosphonic acid and derivative thereof such as ester, for example, phosphonic acid, dimethyl phosphonate, di-n-butyl phosphonate, phenylphosphonate, diphenyl phosphonate, or dibenzyl phosphonate; phosphinic acid and derivative thereof such as ester, for example, phosphinic acid or phenyl phosphinate. Among these, phosphonic acid is preferable.

These compounds (organic carboxylic acid, oxo acid of phosphorus, or derivative thereof may be used alone or in combination.

The content of these compounds (organic carboxylic acid, oxo acid of phosphorus, or derivative thereof) is appropriately decided according to the kind of the selected compound, but is preferably 0.01 pans by mass or more based on 100 parts by mass of the polymer for resist. By adjusting the content of these compounds within the above range, the resulting resist pattern shape can have nearly rectangular profile. The content of these compounds organic carboxylic acid, oxo acid of phosphorus, or derivative thereof is preferably 5 parts by mass or less based or 100 parts by mass of the polymer for resist. By adjusting the content of these compounds within the above range, thickness loss of the resist patter car be reduced.

The chemically amplified photoresist composition of the present invention can contain either of a nitrogen-containing compound, and at least one selected from the group consisting of an organic carboxylic acid, oxo acid of phosphorus and a derivative thereof, or ca con tai only one of them.

Furthermore, the resist composition of the present invention can contain various additives such as surfactants, quenchers other than the nitrogen-containing compound sensitizers, antihalation agents, storage stabilizers, and defoamers if necessary. These additives can be used as long as they are known in this field. The amount of these additives is not specifically limited and may be appropriately decided.

The polymer for positive resist of the present invention may be used as resist compositions for metal etching, photofabrication, plate making, hologram color filter, and phase difference film.

3. Method for Producing Pattern of the Present Invention

Subsequently, an example of a pattern forming method of the present invention will be described.

First, the resist composition of the present invention is coated on the surface of a to-be-processed substrate such as silicone wafer, on which a pattern is formed, by spin coating. The to-be-processed substrate coated with the resist composition is dried by a baking treatment (prebaking) to form a resist film on the substrate.

Then, the resist film thus obtained is exposed to light having a wavelength of 250 nm or less through a photomask (exposure). Light used in exposure is preferably KrF excimer laser, ArF excimer laser or $F_2$ excimer laser, and particularly preferably ArF excimer laser. It is preferred to expose to electron beam.

After the exposure, the exposed substrate is subjected to a heat treatment (post exposure baking, PEB) and dipped in an alkali developing solution, thereby dissolving the exposed are in the developing solution (development). The alkali developing solution to be used may be any one which is known. After the development the substrate is appropriately rinsed with pure water or the like. Thus, a resist pattern is formed on the to-be-processed substrate.

Usually, the to-be-processed substrate with a resist pattern formed thereon is appropriately subjected to a heat treatment (postbaking) thereby reinforcing the resist and the resist free area is selectively etched. After the etching, the resist is usually removed by a remover.

EXAMPLES

The present invention will now be described in detail by way of examples, but the present invention is not limited thereto.

In the examples and comparative example the measurement of physical properties of the polymer and the evaluation of the resist were conducted by the following procedures.

<Weight Average Molecular Weight of Polymer>

About 20 mg of a polymer was dissolved in 5 mL of THF, followed by filtration with a 0.5 μm membrane filter to prepare a sample solution. Using the sample solution, weight average molecular weight of the polymer was measured by gel permeation chromatography (GPC) manufactured by Tosoh Corporation. Using three separation columns manufactured by SHOWA DENKO K.K. under the trade name of Shodex GPC K-805L arranged in series and using THF as a solvent, the measurement was conducted under the conditions of a flow rate of 1.0 mL/min. a measuring temperature of 40° C. and a charge amount of 0.1 mL. A differential refractometer was used as a detector and polystyrene was used as a standard polymer.

<Thermostability of Acetal Structure of Polymer>

Thermostability of a polymer was determined by the following procedure. Namely, 30 g of the polymer was heated with stirring in a test tube at 100° C. for 4 hours using Personal Organic Synthesizer, ChemiStation PPS-2510 manufactured by TOKYO RIKAKIKAI CO., LTD. and then $^1$H-NMR was measured before and after heating with stirring. This measurement was conducted by the following procedure. Namely, a about 5 mass % solution of a polymer for positive resist sample in deuterated chloroform, deuterated acetone, or deuterated dimethyl sulfoxide was charged in a test tube having a diameter of 5 mmφ and the measurement was conducted under the conditions of a measuring temperature of 40° C., a measuring frequency of 270 MHz, and a single pass mode 64 times using an apparatus manufactured by JEOL Ltd. under the trade name of JN GX-270 model FT-NMR.

Thermostability was evaluated by the degree of change in a proportion of hydrogen combined with carbon interposed between oxygen and oxygen of the acetal structure.

Thermostability index={(integrated value of hydrogen combined with carbon interposed between oxygen and oxygen after thermal decomposition test)/(total integrated value between chemical shift δ values of 0 to 2.6 ppm after thermal decomposition test)}/{(integrated value of hydrogen combined with carbon interposed between oxygen and oxygen before thermal decomposition test)/(total integrated value between chemical shift δ values of 0 to 2.6 ppm before thermal decomposition test)}

The closer a thermostability index gets to 1, the higher thermostability of the acetal becomes. When the thermostability index is less than 1, thermostability of the acetal is low.

Example 1

Synthesis of Methacrylate Represented by the Following Formula (A-1)

[Chemical Formula 39]

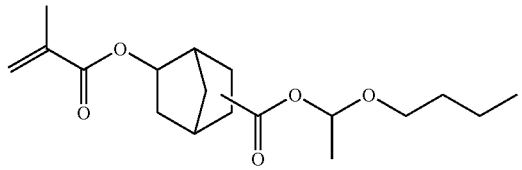

(A-1)

In a 1 L glass three-necked flask equipped with a stirrer, a thermometer, and a reflux condenser tube, 69.0 g (0.50 mol) of norbornenecarboxylic acid, 129.0 g (1.5 mol) of methacrylic acid, and 4.8 g (0.05 mol) of methanesulfonic acid were charged and the temperature was raised to 130° C. while stirring. While maintaining the temperature of the flask at 130° C., the reaction was conducted for 2 hours. After the completion of the reaction, the reaction solution was cooled in an ice bath and then 200 ml of toluene and 100 ml of water were added while stirring. The solution was transferred to a separatory tunnel and, after removing the aqueous layer the toluene layer was concentrated to obtain 110.0 g of a methacrylic acid adduct of the following formula (7).

110.0 g of the resulting methacrylic acid adduct represented by the formula (7) and 73.7 g (0.74 mol) of butyl vinyl ether were charged in a 300 ml glass three-necked flask equipped with a stirrer, a thermometer and a reflux condenser tube, the temperature was raised to 10° C. while stirring. While maintaining the temperature of the flask at 100° C. the reaction was conducted for 3 hours and a half. Disappearance of the methacrylic acid adduct was confirmed by gas chromatography and production of a methacrylate represented by the formula (A-1) was conformed by $H^1$-NMR. After the completion of the reaction, the ester was cooled to room temperature to obtain a crude product (A-1).

To purify the crude product (A-1) by distillation, it was heated to 160° C. using an oil bath and a fraction at an overhead temperature of 108° to 145° C. was separated at a vacuum degree of 26.6 to 79.8 Pa. However, thermal decomposition occurred during distillation and the separated fraction was a methacrylic acid adduct as the raw material and therefore purification by distillation could not be conducted. Therefore, in the following operation the crude product (A-1), which is not purified by distillation after the completion of the reaction, was used as the methacrylate represented by the formula (A-1).

Example 2

Synthesis of Copolymer P-1

In a flask equipped with a nitrogen introducing tube, a stirrer, a condenser and a thermometer 22.4 parts of propylene glycol monomethyl ether acetate (hereinafter referred to as PGMEA) was charged under a nitrogen atmosphere and the temperature of a hot water bath was raised to 80° C. while stirring. From a dropping apparatus containing a monomer solution prepared by mixing 14.3 parts of a methacrylate, 7.5 parts of a monomer represented by the following formula (hereinafter referred to as GBLMA) represented by the formula (A-1):

[Chemical Formula 40]

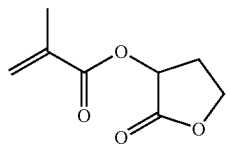

(GBMLA)

5.2 parts of HAdMA represented by the following formula:

[Chemical Formula 41]

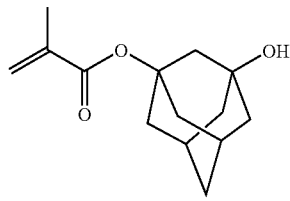

(HAdMA)

40.4 parts of PGMEA, and 3.04 parts of dimethyl-2,2'-azobisisobutyrate (hereinafter referred to as DAIB), the monomer solution was added dropwise in the flask at a fixed rate over 4 hours. Then, the temperature was maintained at 80° C. for 3 hours.

Then the resulting reaction solution was added dropwise in an about 10-fold amount of a solvent mixture of methanol and water in a volume ratio of 8:2 to obtain a precipitate of a white precipitate (copolymer P-1). A wet powder obtained by filtering this precipitate was washed in a solvent mixture of methanol and water in a volume ratio of 9:1 in an amount which is about 10 times as much as that of the reaction solution. After washing the precipitate was collected by filtration and then dried under reduced pressure at 60° C. for about 40 hours to obtain a copolymer P-1. Thermostability of the acetal structure of the resulting copolymer P-1 was measured. The results are shown in Table 1.

Example 3

Synthesis of Methacrylate Represented by the Following Formula (A-2)

[Chemical Formula 42]

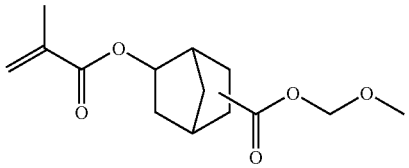

(A-2)

In a 1 L glass three-necked flask equipped with a stirrer, a thermometer, and a reflux condenser tube, 69.0 g (0.50 mol) of norbornenecarboxylic acid, 129.0 g (1.5 mol) of methacrylic acid and 4.8 g (0.05 mol) of methanesulfonic acid were charged and the temperature was raised to 130° C. while stirring. While maintaining the temperature of the flask at 130° C., the reaction was conducted for 2 hours. After the completion of the reaction, the reaction solution was cooled in an ice bath and then 200 ml of toluene and 100 ml of water were added while stirring. The solution was transferred to a separatory funnel and, after removing the aqueous layer, the toluene layer was concentrated to obtain 110.0 g of a methacrylic acid adduct of the following formula (7).

[Chemical Formula 43]

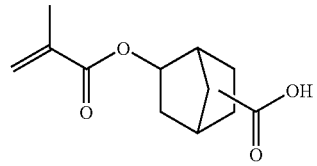

(7)

110.0 g of the resulting methacrylic acid adduct represented by the formula (7) was charged in a 1 L glass three-necked flask equipped with a stirrer and a thermometer, and then 200 ml of dimethyl for amide and 505 g of triethylamine were added, followed by stirring. While maintaining the inner temperature at 25° C. under stirring, 40.2 g (0.5 mol) of chloromethyl methyl ether was added dropwise over 2 hours using a dropping funnel. After the completion of the dropwise addition and stirring at room temperature for one hour, 600 ml of toluene and 200 ml of water were added. The solution was transferred to a separator funnel and, after removing the aqueous layer, the toluene layer was concentrated. This concentrated solution was purified by distillation under reduced pressure to obtain 96.6 g (0.36 mol) of a methacrylate represented by the formula (A-2).

Example 4

Synthesis of Copolymer P-2

In a flask equipped with a nitrogen introducing tube, a stirrer, a condenser and a thermometer, 185.3 parts of PGMEA was charged under a nitrogen atmosphere and the temperature of a hot water bath was raised to 80° C. while stirring. Using a dropping apparatus, a monomer solution prepared by mixing 107.2 parts of a methacrylate represented by the formula (A-2), 68.0 pats of GBLMA, 47.2 parts of HAdMA, 333.6 parts of PGMEA, 6.56 parts of 2,2'-azobisisobutyronitrile (hereinafter referred to as AIBN) and 1.75 parts of n-octylmercaptan (hereinafter referred to as nOM) was added dropwise in the flask at a fixed rate over 6 hours, followed by maintaining at 80° C. for one hour. Then the resulting reaction solution was added dropwise in an about 30-fold amount of methanol with stirring to obtain a colorless precipitate (copolymer P-2). The resulting precipitate was filtered so as to remove the residual monomer included in the precipitate and the precipitate was washed in methanol in an amount which is about 30 times as much as that of the monomer used in the polymerization. Then, the precipitate was collected by filtration and dried under reduced pressure at 50° C. for about 40 hours. Physical properties of the resulting copolymer P-2 were evaluated. The results are shown in Table 1.

Example 5

Synthesis of Methacrylate Represented by the Following Formula (A-3)

[Chemical Formula 44]

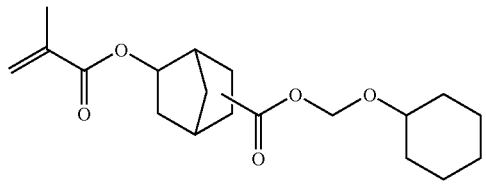

(A-3)

110.0 g of a methacrylic acid adduct represented by the formula (7) obtained in the same manner as in Example 3 was charged in a 1 L glass three-necked flask equipped with a stirrer and a thermometer and then 200 ml of dimethyl formamide and 50.5 g of triethylamine were added followed by stirring. While maintaining the inner temperature at 25° C. under stirring 74.0 g (0.5 mol) of chloromethyl cyclohexyl ether was added dropwise over 3 hours using a dropping funnel. After the completion of the dropwise addition and stirring at room temperature for one hour, 600 ml of toluene and 200 ml of water were added. The solution was transferred to a separatory funnel and after removing the aqueous layer, the toluene layer was concentrated. The concentrated solution was mixed with 0.5 g of powdered sodium hydroxide and then purified by distillation under reduced pressure to obtain 107.5 g (0.32 mol) of a methacrylate represented by the above formula (A-3).

Example 6

Synthesis of Copolymer P-3

In the same manner as that in Example 3 except that the amount of PGMEA to be charged in the flask was 202.8 parts and a monomer solution prepared by mixing 134.4 parts of a methacrylate represented by the formula (A-3), 68.0 parts of GBLMA, 41.0 parts of 5 or 6-cyanobicyclo[2.2.1]heptyl-2-methacrylate (hereinafter referred to as CNNMA) represented by the following formula:

[Chemical Formula 45]

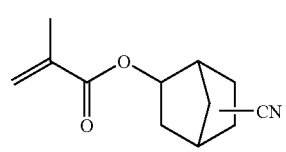

(CNNMA)

365.1 parts of PCMEA, 6.56 parts of AIBN, and 0.58 parts of nOM was used as the monomer solution, a copolymer P-3 was obtained. Physical properties of the copolymer P-3 were evaluated. The results are shown in Table 1.

TABLE 1

|  |  | Example 2 | Example 4 | Example 6 |
|---|---|---|---|---|
| Copolymer |  | P-1 | P-2 | P-3 |
| Mass average molecular weight (Mw) |  | 25,000 | 8,00 | 11,000 |
| Molecular weight distribution (Mw/Mn) |  | 3.19 | 1.60 | 1.77 |
| Composition ratio of monomer unit in polymer (mol %) | A-1 | 40 | — | — |
|  | A-2 | — | 40 | — |
|  | A-3 | — | — | 40 |
|  | GBLMA | 40 | 40 | 40 |
|  | HAdMA | 20 | 20 | — |
|  | CNNMA | — | — | 20 |
| Heat stability index of polymer |  | 0.52 | 0.96 | 0.89 |

INDUSTRIAL APPLICABILITY

The polymer of the present invention is useful as a constituent component resin of a positive resist. When the polymer of the present invention is used as a resist resin in DUV excimer laser lithography, electron beam lithography, or EUV lithography, it is possible to stably form a fine resist pattern with high accuracy because of high sensitivity high resolution, and excellent line edge roughness and trailing.

What is claimed is:

1. A copolymer, consisting essentially of:
   a constituent unit consisting of a monomer represented by formula (2):

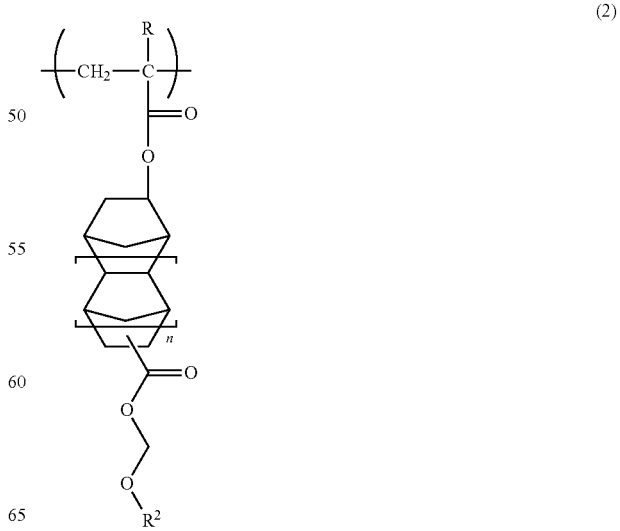

(2)

wherein

R represents a hydrogen atom or a methyl group, $R^2$ represents an alkyl group having 1 to 20 carbon atoms, n is 0 or 1, and one or more units comprising a monomer having a lactone structure in a molecule, and one or more constituent units comprising a monomer containing an alicyclic skeleton having a hydroxyl group or a cyano group in a molecule.

2. A copolymer, consisting essentially of:

a constituent unit consisting of a monomer represented by formula (2):

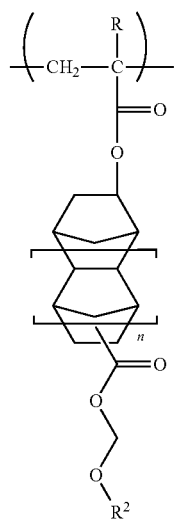

(2)

wherein

R represents a hydrogen atom or a methyl group, $R^2$ represents an alkyl group having 1 to 20 carbon atoms, and n is 0 or 1, and one or more constituent units comprising a monomer having a lactone structure in a molecule, and one or more constituent units comprising a monomer containing an alicyclic skeleton having a hydroxyl group or a cyano group in a molecule, and one or more constituent units selected from the group consisting of: monomers represented by formulae (6-1), (6-2), (6-4), (6-5), (6-14), (6-15), (6-16), (6-18), (6-57), (6-58), (6-65), (6-66), and (6-67):

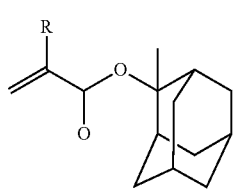

(6-1)

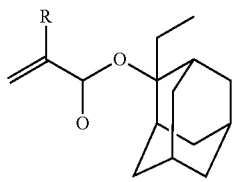

(6-2)

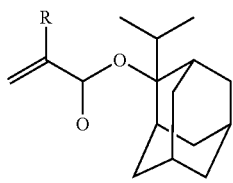

(6-4)

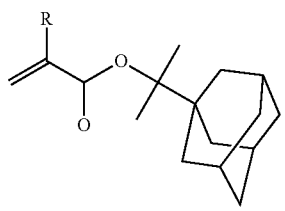

(6-5)

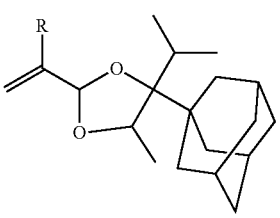

(6-14)

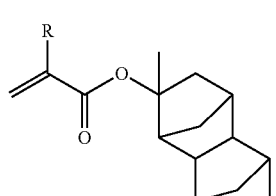

(6-15)

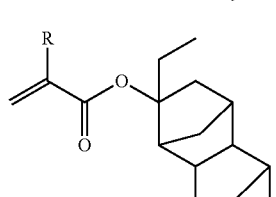

(6-16)

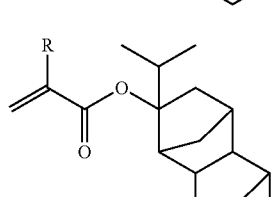

(6-18)

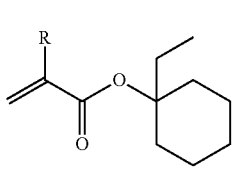

(6-57)

-continued

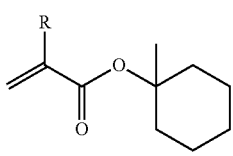
(6-58)

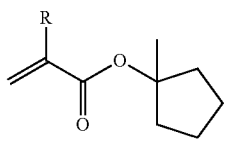
(6-65)

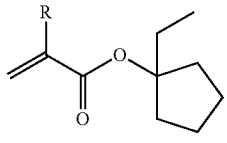
(6-66)

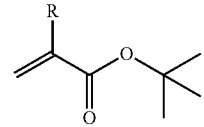
(6-67)

wherein R represents a hydrogen atom or a methyl group.

3. A copolymer according to claims 1 or 2, further comprising one or more constituent units selected from the group consisting of: monomers represented by the formulae (6-22) and (6-64):

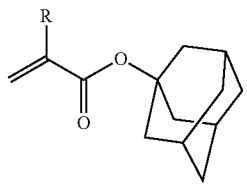
(6-22)

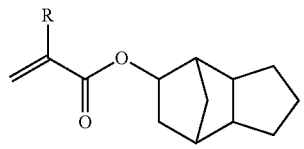
(6-64)

wherein R represents a hydrogen atom or a methyl group.

4. A copolymer according to claims 1 or 2, wherein said one or more constituent units comprising a monomer containing an alicyclic skeleton having a hydroxy group or a cyano group in a molecule are selected from the group consisting of: monomers represented by formulae (6-19) and (6-74):

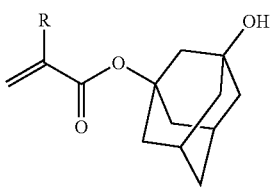
(6-19)

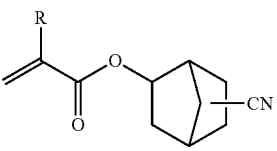
(6-74)

wherein R represents a hydrogen atom or a methyl group.

5. A resist composition comprising the copolymer according claim 1.

6. A resist composition comprising the copolymer according claim 2.

7. A pattern forming method comprising the steps of:
   coating the resist composition according to claim 5 on a to-be-processed substrate,
   exposing the coated substrate to light having a wavelength of 250 nm or less, and
   developing the exposed substrate using a developing solution to form a pattern.

8. A pattern forming method comprising the steps of:
   coating the resist composition according to claim 6 on a to-be-processed substrate,
   exposing the coated substrate to light having a wavelength of 250 nm or less, and
   developing the exposed substrate using a developing solution to form a pattern.

* * * * *